(12) United States Patent
Date

(10) Patent No.: US 11,749,348 B2
(45) Date of Patent: Sep. 5, 2023

(54) SEMICONDUCTOR STORAGE DEVICE CONTROLLING A VOLTAGE APPLIED AT A START OF A VERIFY OPERATION IN EACH OF PLURAL LOOPS INCLUDED IN A WRITE SEQUENCE

(71) Applicant: Kioxia Corporation, Tokyo (JP)

(72) Inventor: Hiroki Date, Chigasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/412,383

(22) Filed: Aug. 26, 2021

(65) Prior Publication Data
US 2022/0301627 A1 Sep. 22, 2022

(30) Foreign Application Priority Data
Mar. 18, 2021 (JP) .................. 2021-045249

(51) Int. Cl.
*G11C 16/04* (2006.01)
*G11C 16/10* (2006.01)
*G11C 16/34* (2006.01)
*G11C 16/08* (2006.01)
*G11C 16/30* (2006.01)
*H10B 69/00* (2023.01)

(52) U.S. Cl.
CPC .......... *G11C 16/10* (2013.01); *G11C 16/0483* (2013.01); *G11C 16/08* (2013.01); *G11C 16/30* (2013.01); *G11C 16/3459* (2013.01); *H10B 69/00* (2023.02)

(58) Field of Classification Search
CPC ..... G11C 16/10; G11C 16/0483; G11C 16/08; G11C 16/30; G11C 16/3459; H01L 27/115

USPC ..................................... 365/185.22
See application file for complete search history.

(56) References Cited

U.S. PATENT DOCUMENTS

| | | |
|---|---|---|
| 9,792,996 B1 | 10/2017 | Date |
| 9,859,012 B1 | 1/2018 | Hioka |
| 10,037,813 B2 | 7/2018 | Maejima et al. |
| 10,079,066 B2 | 9/2018 | Hioka |
| 10,210,938 B2 | 2/2019 | Harada |
| 10,319,450 B2 | 6/2019 | Maejima et al. |
| 10,403,374 B2 | 9/2019 | Hioka |

(Continued)

FOREIGN PATENT DOCUMENTS

| | | |
|---|---|---|
| JP | 6323931 B2 | 5/2018 |
| JP | 6490018 B2 | 3/2019 |

(Continued)

*Primary Examiner* — Tha-O H Bui
(74) *Attorney, Agent, or Firm* — Holtz, Holtz & Volek PC

(57) ABSTRACT

A semiconductor storage device includes: a plurality of first memory cells; a word line connected to gates of the first memory cells; a voltage generation circuit configured to generate voltage to be supplied to the word line on the basis of a set value; and a control unit configured to execute a write sequence that includes a plurality of loops, each loop including a program operation to increase a threshold voltage of at least part of the first memory cells to thereby write data to the first memory cells and a verify operation to verify the data written to the first memory cells. The voltage generation circuit generates voltage to be supplied to the word line at start of the verify operation on the basis of a first set value, and the control unit adjusts the first set value in accordance with progress of the write sequence.

18 Claims, 24 Drawing Sheets

(56) References Cited

U.S. PATENT DOCUMENTS

| | | |
|---|---|---|
| 10,418,118 B2 | 9/2019 | Date |
| 10,614,900 B2 | 4/2020 | Maejima et al. |
| 10,622,079 B2 | 4/2020 | Date |
| 10,685,689 B2 | 6/2020 | Date |
| 10,720,208 B2 | 7/2020 | Suzuki |
| 10,796,764 B2 | 10/2020 | Harada |
| 10,796,779 B2 | 10/2020 | Maejima et al. |
| 11,049,573 B2 | 6/2021 | Funatsuki et al. |
| 2008/0253181 A1* | 10/2008 | Edahiro ............. G11C 16/3418 365/185.17 |
| 2019/0267108 A1* | 8/2019 | Maejima ................ G11C 16/24 |
| 2020/0082855 A1* | 3/2020 | Date ..................... H10B 43/35 |
| 2020/0258556 A1 | 8/2020 | Date |

FOREIGN PATENT DOCUMENTS

| | | |
|---|---|---|
| JP | 6652457 B2 | 1/2020 |
| JP | 6652470 B2 | 1/2020 |
| JP | 2020047329 A | 3/2020 |
| JP | 2020202002 A | 12/2020 |
| TW | 201711206 A | 3/2017 |

* cited by examiner

| Page | DATA | | | | | | | |
|---|---|---|---|---|---|---|---|---|
| Upper | 1 | 1 | 0 | 0 | 0 | 1 | 1 | 0 |
| Middle | 1 | 0 | 0 | 1 | 1 | 1 | 0 | 0 |
| Lower | 1 | 1 | 1 | 1 | 0 | 0 | 0 | 0 |

FIG. 9

| VERIFY TARGET LEVEL \ THE NUMBER OF LOOPS | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "A" LEVEL (VfyA) | O | O | O | O | | | | | | | | | | | | | | | |
| "B" LEVEL (VfyB) | | O | O | O | O | O | | | | | | | | | | | | | |
| "C" LEVEL (VfyC) | | | | | O | O | O | O | | | | | | | | | | | |
| "D" LEVEL (VfyD) | | | | | | | O | O | O | O | O | O | | | | | | | |
| "E" LEVEL (VfyE) | | | | | | | | | O | O | O | O | O | O | | | | | |
| "F" LEVEL (VfyF) | | | | | | | | | | | | O | O | O | O | O | | | |
| "G" LEVEL (VfyG) | | | | | | | | | | | | | | O | O | O | O | O | O |

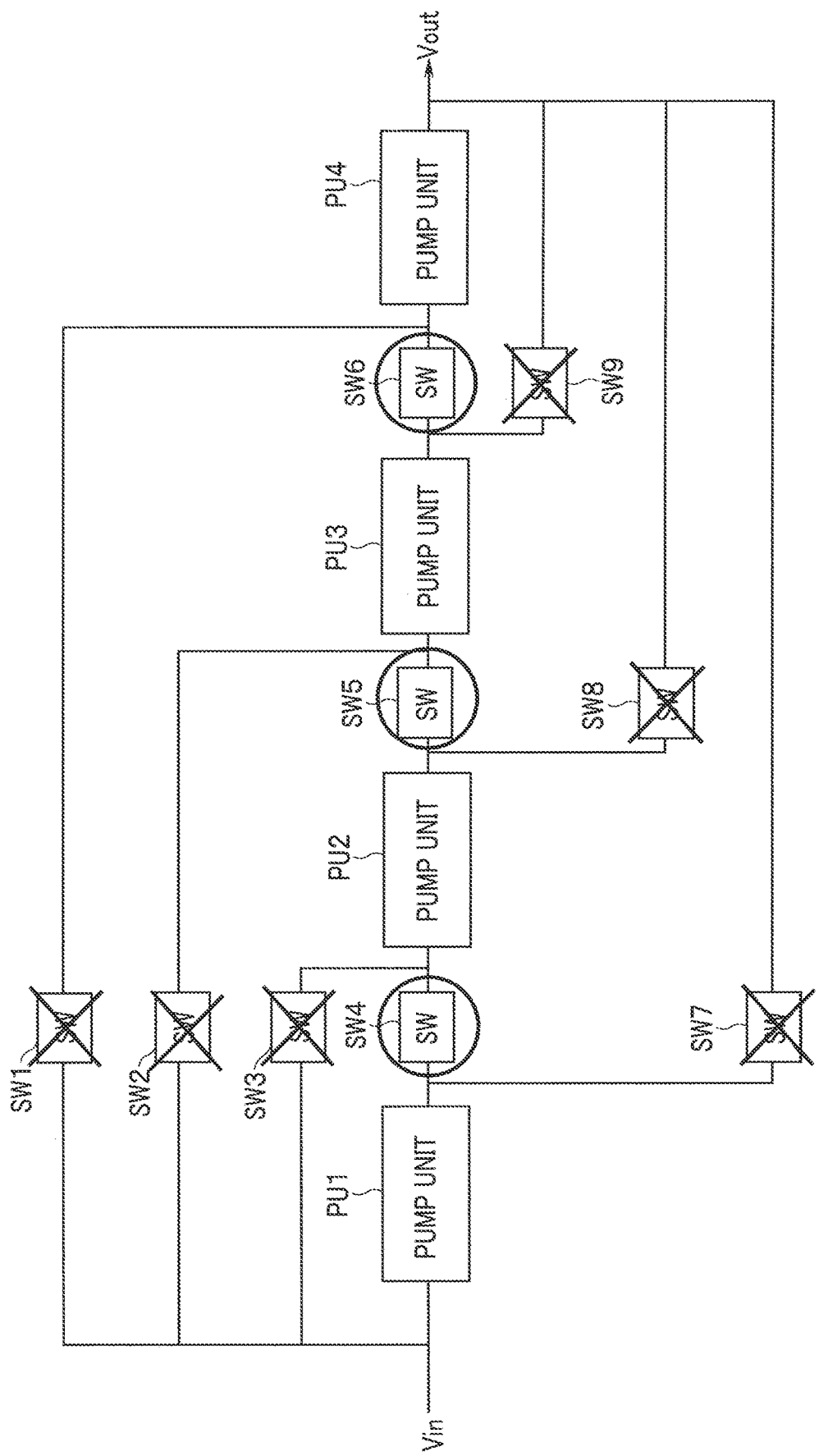

SEMICONDUCTOR STORAGE DEVICE CONTROLLING A VOLTAGE APPLIED AT A START OF A VERIFY OPERATION IN EACH OF PLURAL LOOPS INCLUDED IN A WRITE SEQUENCE

CROSS-REFERENCE TO RELATED APPLICATIONS

This application is based upon and claims the benefit of priority from the prior Japanese Patent Application No. 2021-045249 filed on Mar. 18, 2021; the entire contents of which are incorporated herein by reference.

FIELD

Embodiments described herein relate generally to a semiconductor storage device.

BACKGROUND

A NAND flash memory has been known as a semiconductor storage device.

BRIEF DESCRIPTION OF THE DRAWINGS

FIG. 9 is a diagram illustrating a relation between the number of loops and each of the program operation and the verify operation in write operation based on a standard write sequence;

FIG. 14D is a block diagram for description of a configuration of a third state;

DETAILED DESCRIPTION

A semiconductor storage device of the present embodiment includes: a plurality of first memory cells; a word line connected to gates of the first memory cells; a plurality of select gate transistors connected to one ends of the first memory cells, respectively; a first select gate line connected to gates of the select gate transistors; a plurality of bit lines electrically connected to the one ends of the first memory cells via the first select gate transistors, respectively; a voltage generation circuit configured to generate voltage to be supplied to the word line on the basis of a set value; and a control unit configured to execute a write sequence that includes a plurality of loops, each loop including a program operation to increase a threshold voltage of at least part of the first memory cells to thereby write data to the first memory cells and a verify operation to verify the data written to the first memory cells. The voltage generation circuit generates voltage to be supplied to the word line at start of the verify operation on the basis of a first set value, and the control unit adjusts the first set value in accordance with progress of the write sequence.

Embodiments will be described below with reference to the accompanying drawings.

First Embodiment (1. Configuration)
(1-1. Configuration of Memory System)

Figure 1:
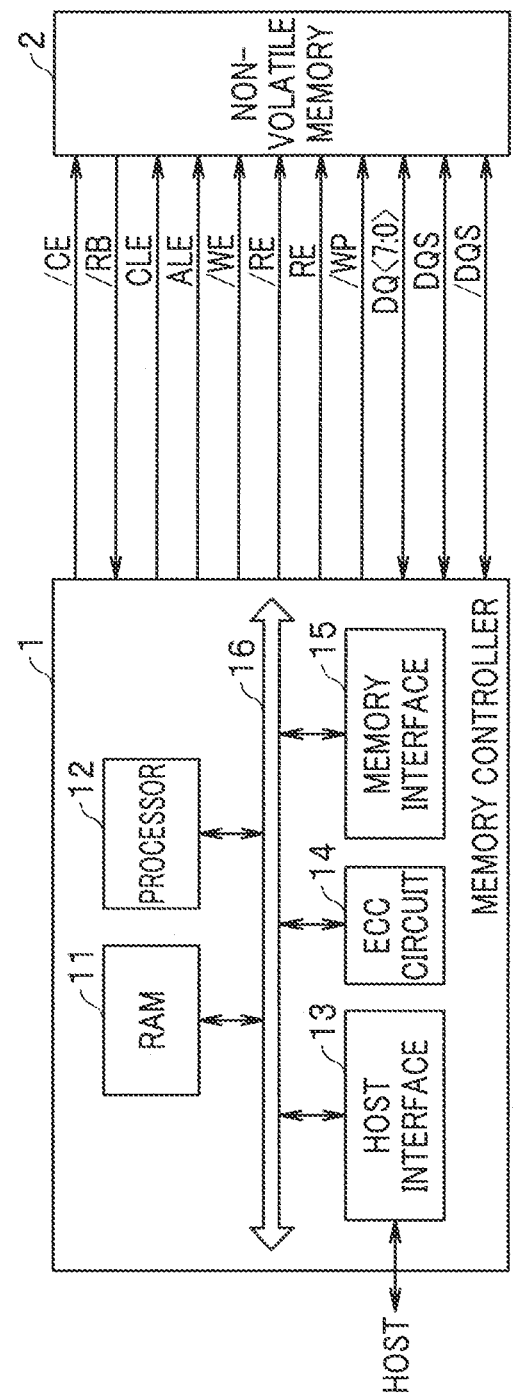
FIG. 1 is a block diagram illustrating a configuration example of a storage device according to an embodiment.

FIG. 1 is a block diagram illustrating a configuration example of a memory system according to an embodiment. The memory system of the embodiment includes a memory controller 1 and a non-volatile memory 2 as a semiconductor storage device. The memory system can be connected to a host. The host is an electronic device such as a personal computer or a portable terminal.

The non-volatile memory 2 is a memory configured to store data in a non-volatile manner, and includes, for example, a NAND memory (NAND flash memory). The non-volatile memory 2 is, for example, a NAND memory including memory cells capable of storing three bits per memory cell, that is, a 3 bit/Cell (triple level cell (TLC)) NAND memory. Note that the non-volatile memory 2 may be a 1 bit/Cell, 2 bit/Cell, or 4 bit/Cell NAND memory.

The memory controller 1 controls data writing to the non-volatile memory 2 in accordance with a writing request from the host. The memory controller 1 controls data reading from the non-volatile memory 2 in accordance with a reading request from the host. A chip enable signal /CE, a ready busy signal /RB, a command latch enable signal CLE, an address latch enable signal ALE, a write enable signal /WE, read enable signals RE and /RE, a write protect signal /WP, signals DQ<7:0> as data, data strobe signals DQS and /DQS are transmitted and received between the memory controller 1 and the non-volatile memory 2.

For example, the non-volatile memory 2 and the memory controller 1 are each formed as a semiconductor chip (hereinafter also simply referred to as "chip").

The chip enable signal /CE is a signal for enabling the non-volatile memory 2. The ready busy signal /RB is a signal for indicating whether the non-volatile memory 2 is in a ready state (state in which a command from outside is to be received) or a busy state (state in which a command from the outside is not to be received). The command latch enable signal CLE is a signal indicating that signals DQ<7:0> are commands. The address latch enable signal ALE is a signal indicating that signals DQ<7:0> are addresses. The write enable signal /WE is a signal for taking a received signal into the non-volatile memory 2 and is asserted each time a command, an address or data is received by the memory controller 1. The non-volatile memory 2 is instructed to take in signals DQ<7:0> while the signal /WE is at "Low (L)" level.

The read enable signals RE and /RE are signals for the memory controller 1 to read data from the non-volatile memory 2. For example, the read enable signals RE and /RE are used to control an operation timing of the non-volatile memory 2 when the signals DQ<7:0> are output. The write protect signal /WP is a signal for instructing the non-volatile memory 2 to inhibit data writing and erasure. The signals DQ<7:0> are main bodies of data transmitted and received between the non-volatile memory 2 and the memory controller 1 and include commands, addresses and data. The data strobe signals DQS and /DQS are signals for controlling input-output timings of the signals DQ<7:0>.

The memory controller 1 includes a random access memory (RAM) 11, a processor 12, a host interface 13, an error check and correct (ECC) circuit 14, and a memory interface 15. The RAM 11, the processor 12, the host interface 13, the ECC circuit 14, and the memory interface 15 are connected to each other through an internal bus 16.

The host interface 13 outputs, to the internal bus 16, a request, user data (write data), and the like received from the host. The host interface 13 also transmits, to the host, user data read from the non-volatile memory 2, a response from the processor 12, and the like.

The memory interface 15 controls, based on an instruction from the processor 12, processing of writing user data and the like to the non-volatile memory 2 and processing of reading user data and the like from the non-volatile memory 2.

The processor 12 collectively controls the memory controller 1. The processor 12 is, for example, a central processing unit (CPU) or a micro processing unit (MPU). When having received a request from the host through the host interface 13, the processor 12 performs control in accordance with the request. For example, in accordance with a request from the host, the processor 12 instructs the memory interface 15 to write user data and parity to the non-volatile memory 2. In addition, in accordance with a request from the host, the processor 12 instructs the memory interface 15 to read user data and parity from the non-volatile memory 2.

The processor 12 determines a storage region (memory region) in the non-volatile memory 2 for user data accumulated in the RAM 11. The user data is stored in the RAM 11 through the internal bus 16. The processor 12 performs the memory region determination for data per page (page data) as the unit of writing. In the present specification, unit data is defined to be user data stored in a page of the non-volatile memory 2. The unit data is typically encoded by the ECC circuit 14 and stored in the non-volatile memory 2 as a code word. In the present embodiment, encoding is not essential. The memory controller 1 may store the unit data in the non-volatile memory 2 without encoding, but FIG. 1 illustrates a configuration example in which encoding is performed. When the memory controller 1 does not perform encoding, the page data is same as the unit data. One code word may be generated based on one unit data or based on divided data into which the unit data is divided. Alternatively, one code word may be generated by using a plurality of pieces of unit data.

The processor 12 determines, for each unit data, a memory region in the non-volatile memory 2 at a writing destination. A physical address is allocated to each memory region in the non-volatile memory 2. The processor 12 manages a memory region as the writing destination of each unit data by using the physical address. The processor 12 specifies the determined memory region (physical address) and instructs the memory interface 15 to write user data to the non-volatile memory 2. The processor 12 manages correspondence between a logical address (logical address managed by the host) of the user data and the physical address. When having received a reading request including a logical address from the host, the processor 12 specifies a physical address corresponding to the logical address and instructs the memory interface 15 to read user data with specification of the physical address.

The ECC circuit 14 generates a code word by encoding user data stored in the RAM 11. In addition, the ECC circuit 14 decodes a code word read from the non-volatile memory 2.

The RAM 11 temporarily stores user data received from the host until storage in the non-volatile memory 2, or temporarily stores data read from the non-volatile memory 2 until transmission to the host. The RAM 11 is a general-purpose memory such as a static random access memory (SRAM) or a dynamic random access memory (DRAM).

FIG. 1 illustrates a configuration example in which the memory controller 1 includes the ECC circuit 14 and the memory interface 15. However, the ECC circuit 14 may be built in the memory interface 15. Alternatively, the ECC circuit 14 may be built in the non-volatile memory 2.

When having received a writing request from the host, the memory system operates as follows. The processor 12 temporarily stores writing target data in the RAM 11. The processor 12 reads the data stored in the RAM 11 and inputs the read data to the ECC circuit 14. The ECC circuit 14 encodes the input data and inputs the code word to the memory interface 15. The memory interface 15 writes the input code word to the non-volatile memory 2.

When having received a reading request from the host, the memory system operates as follows. The memory interface 15 inputs, to the ECC circuit 14, a code word read from the non-volatile memory 2. The ECC circuit 14 decodes the input code word and stores the decoded data in the RAM 11. The processor 12 transmits the data stored in the RAM 11 to the host through the host interface 13.

(1-2. Configuration of Non-Volatile Memory)

Figure 2:
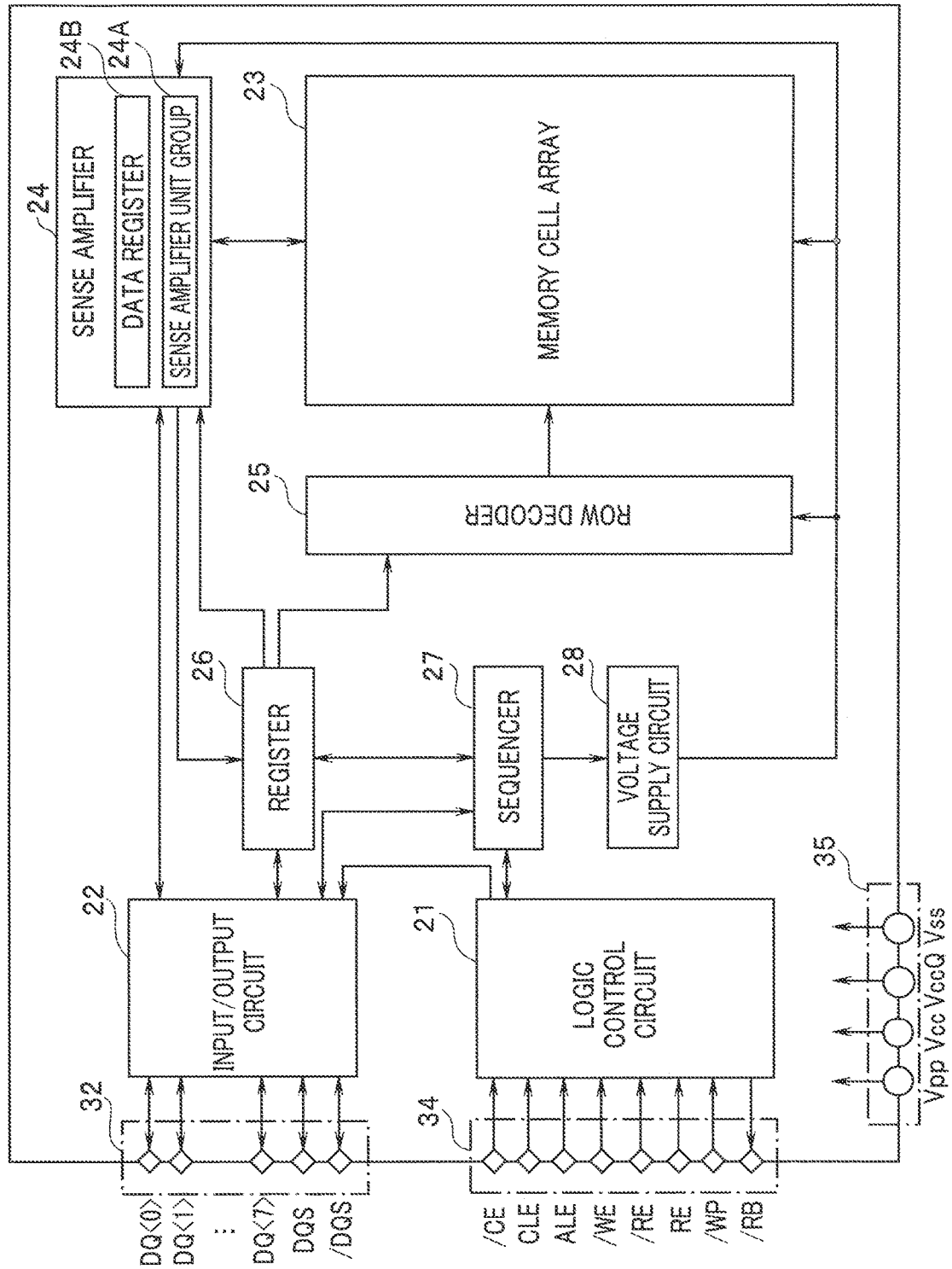
FIG. 2 is a block diagram illustrating a configuration example of a non-volatile memory of the embodiment.

FIG. 2 is a block diagram illustrating a configuration example of the non-volatile memory of the present embodiment. The non-volatile memory 2 includes a logic control circuit 21, an input-output circuit 22, a memory cell array 23, a sense amplifier 24, a row decoder 25, a register 26, a sequencer 27, a voltage supply circuit 28, an input-output pad group 32, a logic control pad group 34, and a power source inputting terminal group 35.

The memory cell array 23 includes a plurality of blocks. Each of these plurality of blocks BLK includes a plurality of memory cell transistors (memory cells). A plurality of bit lines, a plurality of word lines, a source line, and the like are disposed in the memory cell array 23 to control voltage applied to the memory cell transistors. A specific configuration of the blocks BLK will be described later.

The input-output pad group 32 includes a plurality of terminals (pads) corresponding to the signals DQ<7:0> and the data strobe signals DQS and /DQS to transmit and receive signals including data to and from the memory controller 1.

The logic control pad group 34 includes a plurality of terminals (pads) corresponding to the chip enable signal /CE, the command latch enable signal CLE, the address latch enable signal ALE, the write enable signal /WE, the read enable signals RE and /RE, and the write protect signal /WP to transmit and receive signals to and from the memory controller 1.

The signal /CE enables selection at the non-volatile memory 2. The signal CLE enables a command transmitted as a signal DQ to be latched at a command register. The signal ALE enables an address transmitted as a signal DQ to be latched at an address register. A signal WE enables writing. The signal RE enables reading. A signal WP inhibits writing and erasure. A signal R/B indicates whether the non-volatile memory 2 is in the ready state (state in which a command from outside can be received) or the busy state (state in which a command from the outside cannot be received). The memory controller 1 can know the state of the non-volatile memory 2 by receiving the signal R/B.

The power source inputting terminal group 35 includes a plurality of terminals through which power voltage Vcc, VccQ, and Vpp and ground voltage Vss are input to supply various kinds of operation power sources to the non-volatile memory 2 from the outside. The power voltage Vcc is circuit power voltage provided as an operation power source typically from the outside, and is input as voltage of, for example, 3.3 V approximately. The power voltage VccQ is input as voltage of, for example, 1.2 V. The power voltage VccQ is used to transmit and receive signals between the memory controller 1 and the non-volatile memory 2.

The power voltage Vpp is power voltage higher than the power voltage Vcc and input as voltage of, for example, 12 V. High voltage of 20 V approximately is needed to write data to the memory cell array 23 or erase data. In this case, desired voltage can be generated faster with smaller electric power consumption by stepping up the power voltage Vpp of 12 V approximately than by stepping up the power voltage Vcc of 3.3 V approximately at a step-up circuit of the voltage supply circuit 28. However, no voltage needs to be supplied for the power voltage Vpp, for example, when the non-volatile memory 2 is used in an environment in which high voltage cannot be supplied. Even when the power voltage Vpp is not supplied, the non-volatile memory 2 can execute various operations as long as the power voltage Vcc is supplied. In other words, the power voltage Vcc is a power source normally supplied to the non-volatile memory 2, and the power voltage Vpp is a power source additionally and optionally supplied in accordance with, for example, a use environment.

The logic control circuit 21 and the input-output circuit 22 are connected to the memory controller 1 through a NAND bus. The input-output circuit 22 transmits and receives signals DQ (for example, DQ0 to DQ7) to and from the memory controller 1 through the NAND bus.

The logic control circuit 21 receives external control signals (for example, the chip enable signal /CE, the command latch enable signal CLE, the address latch enable signal ALE, the write enable signal /WE, the read enable signals RE and /RE, and the write protect signal /WP) from the memory controller 1 through the NAND bus. The symbol "/" in each signal name indicates active low. The logic control circuit 21 transmits the ready/busy signal /RB to the memory controller 1 through the NAND bus.

The input-output circuit 22 transmits and receives the signals DQ<7:0> and the data strobe signals DQS and /DQS to and from the memory controller 1. The input-output circuit 22 forwards commands and addresses in the signals DQ<7:0> to the register 26. The input-output circuit 22 also transmits and receives write data and read data to and from the sense amplifier 24.

The register 26 includes a command register, an address register, and a status register and the like. The command register temporarily stores a command. The address register temporarily stores an address. The status register temporarily stores data necessary for operation of the non-volatile memory 2. The register 26 is configured as, for example, an SRAM.

The sequencer 27 as a control unit receives a command from the register 26 and controls the non-volatile memory 2 in accordance with a sequence based on the command.

The voltage supply circuit 28 receives power voltage from the outside of the non-volatile memory 2 and generates a plurality of voltages necessary for write operation, read operation, and erasure operation by using the power voltage. The voltage supply circuit 28 supplies the generated voltages to the memory cell array 23, the sense amplifier 24, the row decoder 25, and the like.

The row decoder 25 receives a row address from the register 26 and decodes the row address. The row decoder 25 performs word-line selection operation based on the decoded row address. Then, the row decoder 25 forwards a plurality of voltages necessary for write operation, read operation, and erasure operation to a selected block.

The sense amplifier 24 receives a column address from the register 26 and decodes the column address. The sense amplifier 24 includes a sense amplifier unit group 24A and a data register 24B. The sense amplifier unit group 24A is connected to each bit line and selects either bit line based on the decoded column address. At data reading, the sense amplifier unit group 24A senses data read from a memory cell transistor to a bit line and amplifies the data. At data writing, the sense amplifier unit group 24A forwards write data to a bit line.

At data reading, the data register 24B temporarily stores data detected by the sense amplifier unit group 24A and serially forwards the data to the input-output circuit 22. At data writing, the data register 24B temporarily stores data serially forwarded from the input-output circuit 22 and forwards the data to the sense amplifier unit group 24A. The data register 24B is configured as, for example, an SRAM.

(1-3. Block Configuration of Memory Cell Array)

Figure 3:
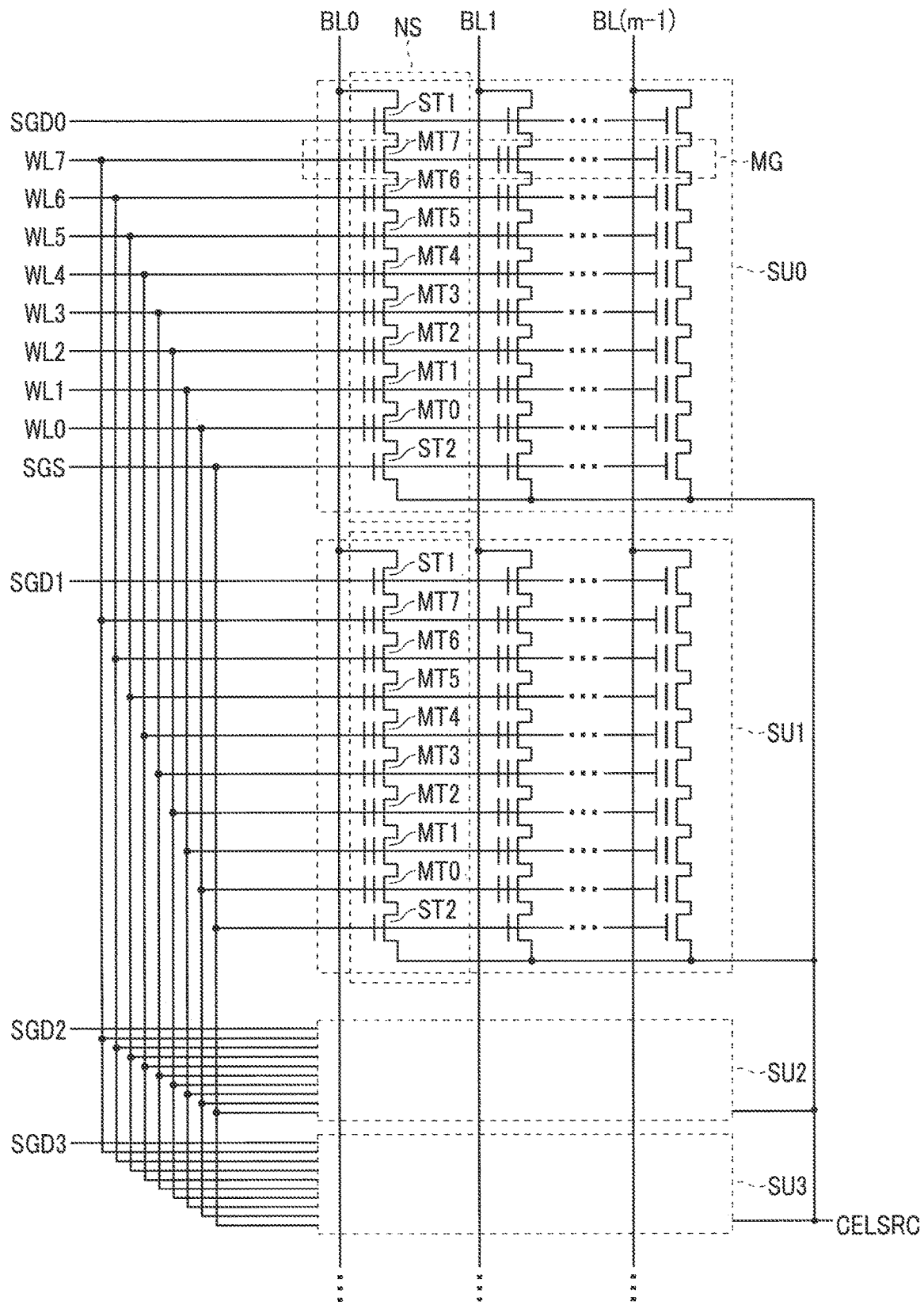
FIG. 3 is a diagram illustrating a configuration example of a block of a NAND memory cell array having a three-dimensional structure.

FIG. 3 is a diagram illustrating a configuration example of a block of the memory cell array 23 having a three-dimensional structure. FIG. 3 illustrates one block BLK among the plurality of blocks included in the memory cell array 23. Any other block of the memory cell array has a configuration same as the configuration in FIG. 3. Note that the present embodiment is also applicable to a memory cell array having a two-dimensional structure.

As illustrated in FIG. 3, each block BLK includes, for example, four string units (SU0 to SU3). Each string unit SU includes a plurality of NAND strings NS. In this example, each NAND string NS includes eight memory cell transistors MT (MT0 to MT7) and select gate transistors ST1 and ST2. Each memory cell transistor MT includes a gate and an electric charge accumulation layer and stores data in a non-volatile manner Note that the number of memory cell transistors MT included in each NAND string NS is eight in this example but not limited to eight and may be, for example, 32, 48, 64, or 96.

The select gate transistors ST1 and ST2 are each illustrated as one transistor in an electric circuit, but may be same as a memory cell transistor in a structure. For example, for cutoff characteristic improvement, the select gate transistors ST1 and ST2 may each include a plurality of select gate transistors. In addition, a dummy cell transistor may be provided among the memory cell transistors MT and the select gate transistors ST1 and ST2.

The memory cell transistors MT are disposed and connected in series with each other between the select gate transistors ST1 and ST2. The memory cell transistor MT7 on one end side is connected to the select gate transistor ST1, and the memory cell transistor MT0 on the other end side is connected to the select gate transistor ST2.

The gates of the select gate transistors ST1 of the respective string units SU0 to SU3 are connected to select gate lines SGD0 to SGD3, respectively (hereinafter referred to as select gate lines SGD when not needed to be distinguished from one another). The gates of the select gate transistors ST2 of the plurality of string units SU in the same block BLK are connected in common with the same select gate line SGS. The gates of the memory cell transistors MT0 to MT7 in the same block BLK are connected in common with the word lines WL0 to WL7, respectively. In other words, the word lines WL0 to WL7 and the select gate line SGS are connected in common with the plurality of string units SU0 to SU4 in the same block BLK, but the select gate lines SGD are independently provided for the respective string units SU0 to SU3 in the same block BLK.

The gates of the memory cell transistors MT0 to MT7 included in each NAND string NS are connected to the word lines WL0 to WL7, respectively. The gates of memory cell transistors MTi on the same row in each block BLK are connected to the same word line WLi. Note that each NAND string NS is also simply referred to as "string" in the following description.

Each NAND string NS is connected to the corresponding bit line. Thus, each memory cell transistor MT is connected to the bit line through the select gate transistors ST and the other memory cell transistors MT included in the NAND string NS. As described above, data of the memory cell transistors MT in the same block BLK is erased all at once. Data reading and writing are performed in the units of memory cell groups MG (or in the units of pages). In the present specification, each memory cell group MG is defined to be a plurality of memory cell transistors MT connected to one word line WLi and belonging to one string unit SU. In read operation and write operation, one word line WLi and one select gate line SGD are selected in accordance with a physical address, and accordingly, a memory cell group MG is selected.

(1-4. Sectional Structure of Non-Volatile Memory)

Figure 4:
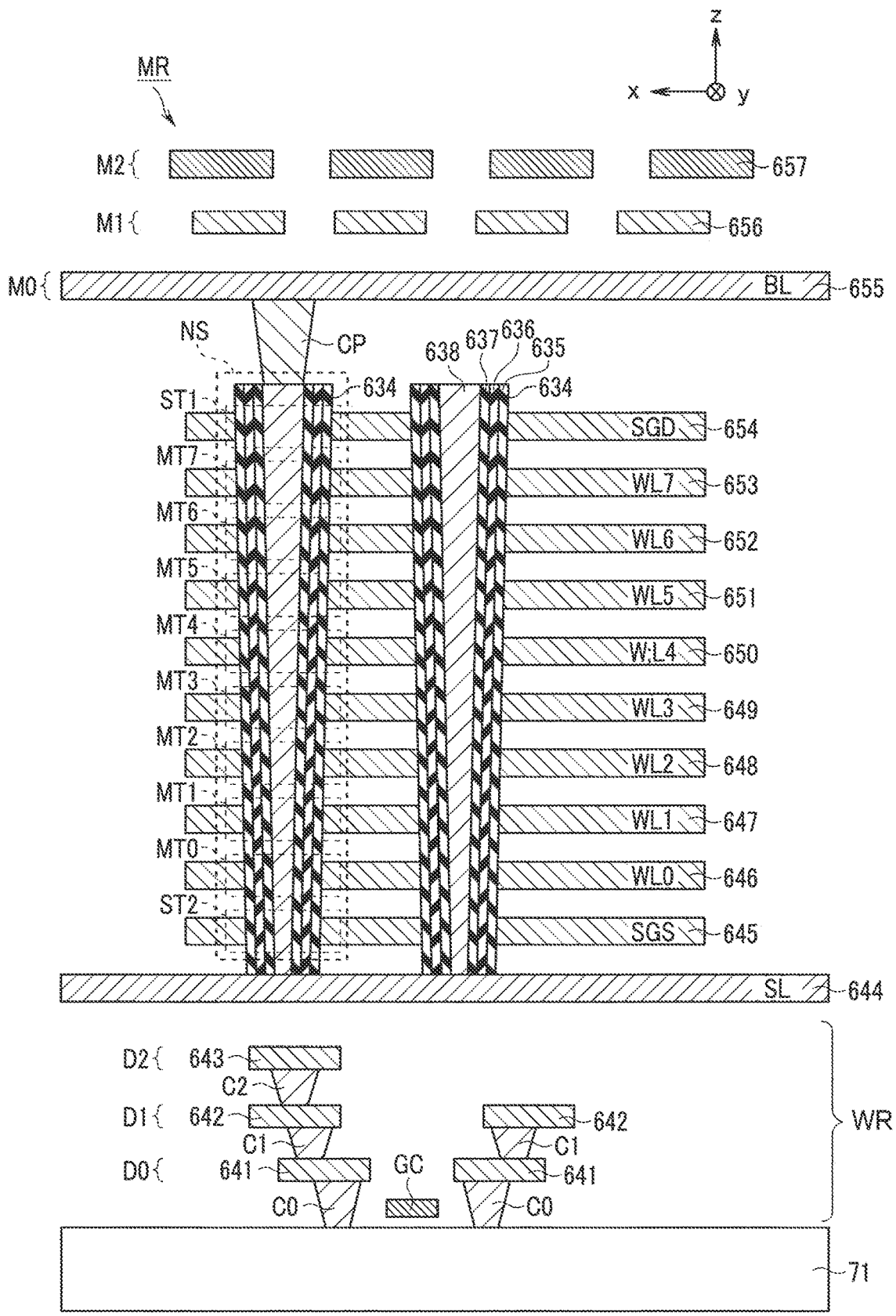
FIG. 4 is a cross-sectional view of a partial region of a semiconductor storage device according to the embodiment.

FIG. 4 is a cross-sectional view of a partial region of the semiconductor storage device according to the embodiment. FIG. 4 illustrates an example in which peripheral circuit regions corresponding to peripheral circuits such as the sense amplifier 24 and the row decoder 25 are provided on a semiconductor substrate 71 and a memory region is provided in a layer above the peripheral circuit regions. Note that, in the following description, an x direction (first direction) and a y direction (second direction) are defined to be two directions parallel to the surface of the semiconductor substrate 71 and orthogonal to each other, and a z direction is defined to be a direction orthogonal to the surface of the semiconductor substrate 71.

As illustrated in FIG. 4, the non-volatile memory includes the semiconductor substrate 71, electric conductors 641 to 657, memory pillars 634, and contact plugs C0, C1, C2, and CP in a memory region MR. Note that FIG. 4, which will be described below, omits illustrations of p-type or n-type well regions formed at an upper surface part of the semiconductor substrate 71, an impurity diffusion region formed in each well region, a gate insulating film that provides insulation among the well regions, and an element separation region.

In the memory region MR, an electric conductor GC is provided on the semiconductor substrate 71 through the gate insulating film (not illustrated). For example, a plurality of contact plugs C0 are provided in a plurality of impurity diffusion regions (not illustrated), respectively, provided on the semiconductor substrate 71 so that the electric conductor GC is sandwiched therebetween. The memory cell array 23 is disposed on the semiconductor substrate 71 through a wiring layer region WR.

The electric conductor 641, which forms a wiring pattern, is provided on each contact plug C0. For example, the electric conductor GC functions as the gate electrode of a transistor, and the electric conductor 641 functions as the source electrode or drain electrode of the transistor.

For example, the contact plug C1 is provided on each electric conductor 641. For example, the electric conductor 642 is provided on each contact plug C1. For example, the contact plug C2 is provided on each electric conductor 642. For example, the electric conductor 643 is provided on the contact plug C2.

Wiring patterns of the electric conductors 641, 642, and 643 are disposed in the wiring layer region WR between a sense amplifier circuit (not illustrated) and the memory cell array. Hereinafter, wiring layers in which the electric conductors 641, 642, and 643 are provided are referred to as wiring layers D0, D1, and D2, respectively. The wiring layers D0, D1, and D2 are provided in a layer below the non-volatile memory 2. Note that, in this example, the three wiring layers are provided in the wiring layer region WR, but two or fewer wiring layers or four or more wiring layers may be provided in the wiring layer region WR.

The electric conductor 644 is provided above the electric conductor 643 through, for example, an interlayer insulating film. The electric conductor 644 is formed in, for example, a plate shape parallel to an xy plane and functions as a source line SL. For example, the electric conductors 645 to 654 are sequentially stacked above the electric conductor 644 for each NAND string NS. An interlayer insulating film (not illustrated) is provided between electric conductors adjacent to each other in the z direction among these electric conductors.

The electric conductors 645 to 654 are each formed in, for example, a plate shape parallel to the xy plane. For example, the electric conductor 645 functions as the select gate line SGS, the electric conductors 646 to 653 function as the word lines WL0 to WL7, respectively, and the electric conductor 654 functions as the select gate line SGD.

Each memory pillar 634 has a column shape, penetrates through each of the electric conductors 645 to 654, and contacts the electric conductor 644. The memory pillar 634 includes, for example, an electric conductor column 638 on a center side, a tunnel insulating film 637 formed on the outer side of the electric conductor column 638, an electric charge accumulation film 636 formed on the outer side of the tunnel insulating film 637, and a block insulating film 635 formed on the outer side of the electric charge accumulation film 636.

For example, a part at which the memory pillar 634 intersects the electric conductor 645 functions as the select gate transistor ST2. A part at which the memory pillar 634 intersects each of the electric conductors 646 to 653 functions as a memory cell transistor (memory cell) MT. A part at which the memory pillar 634 intersects the electric conductor 654 functions as the select gate transistor ST1.

The electric conductor 655 is provided through an interlayer insulating film in a layer above an upper surface of the memory pillar 634. The electric conductor 655 is formed in a line shape extending in the x direction and corresponds to a bit line BL. A plurality of electric conductors 655 are arrayed at intervals in the y direction (not illustrated). The electric conductor 655 is electrically connected, for each string unit SU, with the electric conductor column 638 in the corresponding one memory pillar 634.

Specifically, in each string unit SU, for example, the contact plug CP is provided on the electric conductor column 638 in each memory pillar 634, and one electric conductor 645 is provided on the contact plug CP. Note that the present embodiment is not limited to such a configuration, but the electric conductor column 638 and the electric conductor 655 in each memory pillar 634 may be connected to each other through a plurality of contacts and wires or the like.

The electric conductor 656 is provided through an interlayer insulating film in a layer above the layer in which the electric conductor 655 is provided. The electric conductor 657 is provided through an interlayer insulating film in a layer above the layer in which the electric conductor 656 is provided.

The electric conductors 656 and 657 correspond to, for example, a wire provided in the memory cell array and a wire for connecting the peripheral circuits provided below the memory cell array. The electric conductors 656 and 657 may be connected to each other through a column-shaped contact (not illustrated). In this example, the layer in which the electric conductor 655 is provided is referred to as a wiring layer M0, the layer in which the electric conductor 656 is provided is referred to as a wiring layer M1, and the layer in which the electric conductor 657 is provided is referred to as a wiring layer M2.

As illustrated in FIG. 4, in the semiconductor storage device of the embodiment, the wiring layers D0, D1, and D2 are formed below each string unit SU. The wiring layers M0, M1, and M2 are formed above each string unit SU. The wiring layers D0, D1, and D2 are tungsten wires formed by, for example, a damascene method.

The wiring layer M2 is, for example, an aluminum wire formed by anisotropic etching such as reactive ion etching (RIE). The wiring layer M2 has a large film thickness and a low resistance, and thus key power source wires (Vcc, Vss) are allocated thereto. The wiring layer M1 is, for example, a copper (Cu) wire formed by the damascene method. The Cu wire has high wiring reliability in, for example, electro migration (EM) resistance, and thus a signal line through which data needs to be reliably transferred is allocated to the wiring layer M1. The wiring layer M0 is, for example, a Cu wire formed by the damascene method. The wiring layer M0 is used as a bit line BL, and part of the key power source wire is allocated thereto for power source reinforcement. Note that a wire such as a signal line other than the key power source wire preferably has a resistance as low as possible and thus is formed by using an upper wiring layer (for example, the wiring layer M2) when possible.

(1-5. Threshold Voltage Distribution of Memory Cell Transistor)

Figures 5, 6:
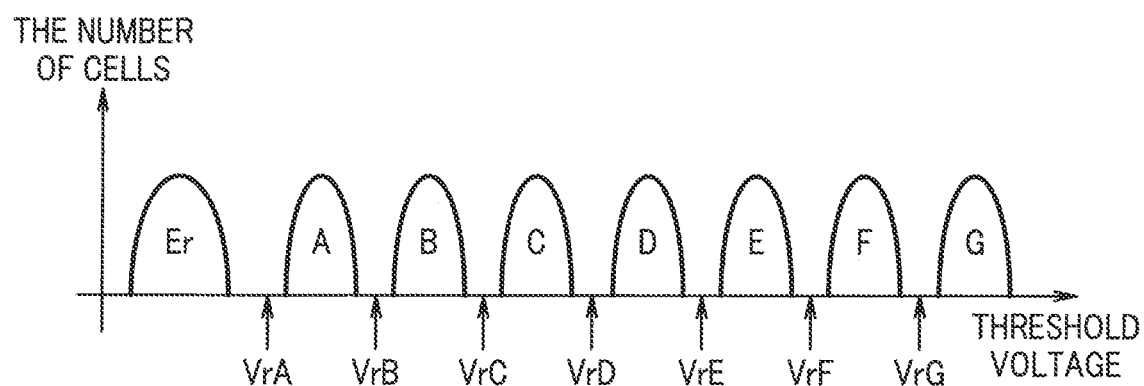
FIG. 5 is a diagram illustrating an example of threshold voltage distribution of the embodiment.
FIG. 6 is a diagram illustrating data coding of the embodiment.

FIG. 5 is a diagram illustrating an example of threshold voltage distribution of the embodiment of the present invention. FIG. 5 illustrates a threshold voltage distribution example of the 3 bit/Cell non-volatile memory 2. The non-volatile memory 2 stores information as an amount of electric charge stored in the electric charge accumulation layer of each memory cell. The memory cell has a threshold voltage in accordance with the amount of electric charge. A plurality of data values stored in the memory cell are associated with a plurality of regions (threshold voltage distribution regions) of the threshold voltage.

In FIG. 5, eight distributions (lobes) denoted by Er, A, B, C, D, E, F, and G correspond to eight threshold voltage distribution regions. In this manner, each memory cell has threshold voltage distributions divided by seven boundaries. In FIG. 5, a horizontal axis represents the threshold voltage, and a vertical axis represents distribution of the number of memory cells (the number of cells).

In the present embodiment, a region in which the threshold voltage is equal to or lower than VrA is referred to as the region Er, a region in which the threshold voltage is higher than VrA and equal to or lower than VrB is referred to as the region A, a region in which the threshold voltage is higher than VrB and equal to or lower than VrC is referred to as the region B, and a region in which the threshold voltage is higher than VrC and equal to or lower than VrD is referred to as the region C. In addition, in the present embodiment, a region in which the threshold voltage is higher than VrD and equal to or lower than VrE is referred to as the region D, a region in which the threshold voltage is higher than VrE and equal to or lower than VrF is referred to as the region E, a region in which the threshold voltage is higher than VrF and equal to or lower than VrG is referred to as the region F, and a region in which the threshold voltage is higher than VrG is referred to as the region G.

The threshold voltage distributions corresponding to the regions Er, A, B, C, D, E, F, and G are referred to as distributions Er, A, B, C, D, E, F, and G (first to eighth distribute), respectively. The voltages VrA to VrG are threshold voltages as the boundaries of the regions.

In the non-volatile memory 2, a plurality of data values are associated with the plurality of respective threshold voltage distribution regions of each memory cell. This association is referred to as data coding. The data coding is determined in advance, and at data writing (programming), electric charge is injected into the memory cell based on the data coding so that the threshold voltage is in a threshold voltage distribution region in accordance with a data value to be stored. At reading, reading voltage is applied to the memory cell, and data is determined based on whether the threshold voltage of the memory cell is lower or higher than the reading voltage.

FIG. 6 is a diagram illustrating the data coding of the embodiment. In the present embodiment, the eight threshold voltage distribution regions illustrated in FIG. 5 are associated with eight data values, respectively, of three bits. A relation among the threshold voltage and data values of bits corresponding to Upper, Middle, and Lower pages is described below.

The memory cell stores "111" when the threshold voltage is in the region Er.

The memory cell stores "101" when the threshold voltage is in the region A.

The memory cell stores "001" when the threshold voltage is in the region B.

The memory cell stores "011" when the threshold voltage is in the region C.

The memory cell stores "010" when the threshold voltage is in the region D.

The memory cell stores "110" when the threshold voltage is in the region E.

The memory cell stores "100" when the threshold voltage is in the region F.

The memory cell stores "000" when the threshold voltage is in the region G.

In this manner, the regions of the threshold voltage can indicate the states of three-bit data in each memory cell. Note that the threshold voltage of the memory cell is in the region Er in a state in which the memory cell is not written (state of "erased"). In the above-described code, only one bit of data changes between any two adjacent states like the state Er (erased) stores data "111" and the state A stores data "101". In this manner, the coding illustrated in FIG. 6 is gray code that only one bit of data changes between any two adjacent regions.

Note that the example in which the eight levels are discretely distributed is described with reference to FIG. 5, but this is an ideal state, for example, right after data writing. Thus, in reality, adjacent levels potentially overlap each other. For example, after data writing, an upper end of the distribution Er and a lower end of the distribution A overlap each other due to disturbance or the like in some cases. In such a case, data is corrected by using, for example, an ECC technology.

(2. Operation)

Subsequently, data write operation in the present embodiment will be described below.

(2-1. Concept of Write Operation)

First, the write operation according to the present embodiment will be briefly described. The write operation roughly includes program operation and verify operation. When multiple-value data is to be written to a memory cell transistor MT, the threshold voltage of the memory cell transistor MT is set to be a value in accordance with a value of the data. When program voltage VPGM and bit line voltage Vbl are applied to the memory cell transistor MT, electrons are injected into the electric charge accumulation film of the memory cell transistor MT and the threshold voltage increases. When the program voltage VPGM is increased, an amount of injected electrons is increased and the threshold voltage of the memory cell transistor MT is increased. However, the amount of injected electrons is different among memory cell transistors MT due to variance among the memory cell transistors MT even when the same program voltage VPGM is applied.

Temporarily injected electrons are held until erasure operation is performed. Thus, the program operation and the verify operation (loop) are performed a plurality of times while the program voltage VPGM is gradually increased so that the threshold voltage to be set to each memory cell transistor MT is in an allowable range of the threshold voltage.

The program operation is operation that increases the threshold voltage by injecting electrons into the electric charge accumulation layer (or maintains the threshold voltage by inhibiting the injection). Hereinafter, the operation that increases the threshold voltage is referred to as ""0" programming" or ""0" writing", data "0" is provided to a bit line BL as a "0" programming target. The operation that maintains the threshold voltage is referred to as ""1" programming", ""1" writing", or "writing inhibition", and data "1" is provided to a bit line BL as a "1" programming target.

The verify operation is read operation performed as part of the write operation. The verify operation is operation that determines whether the threshold voltage of each memory cell transistor MT has reached a target level by reading data after the program operation. A memory cell transistor MT, the threshold voltage of which has reached the target level is then set to writing inhibition. Combination of the program operation and the verify operation described above is repeated to increase the threshold voltage of the memory cell transistor MT to the target level.

Figure 7A:
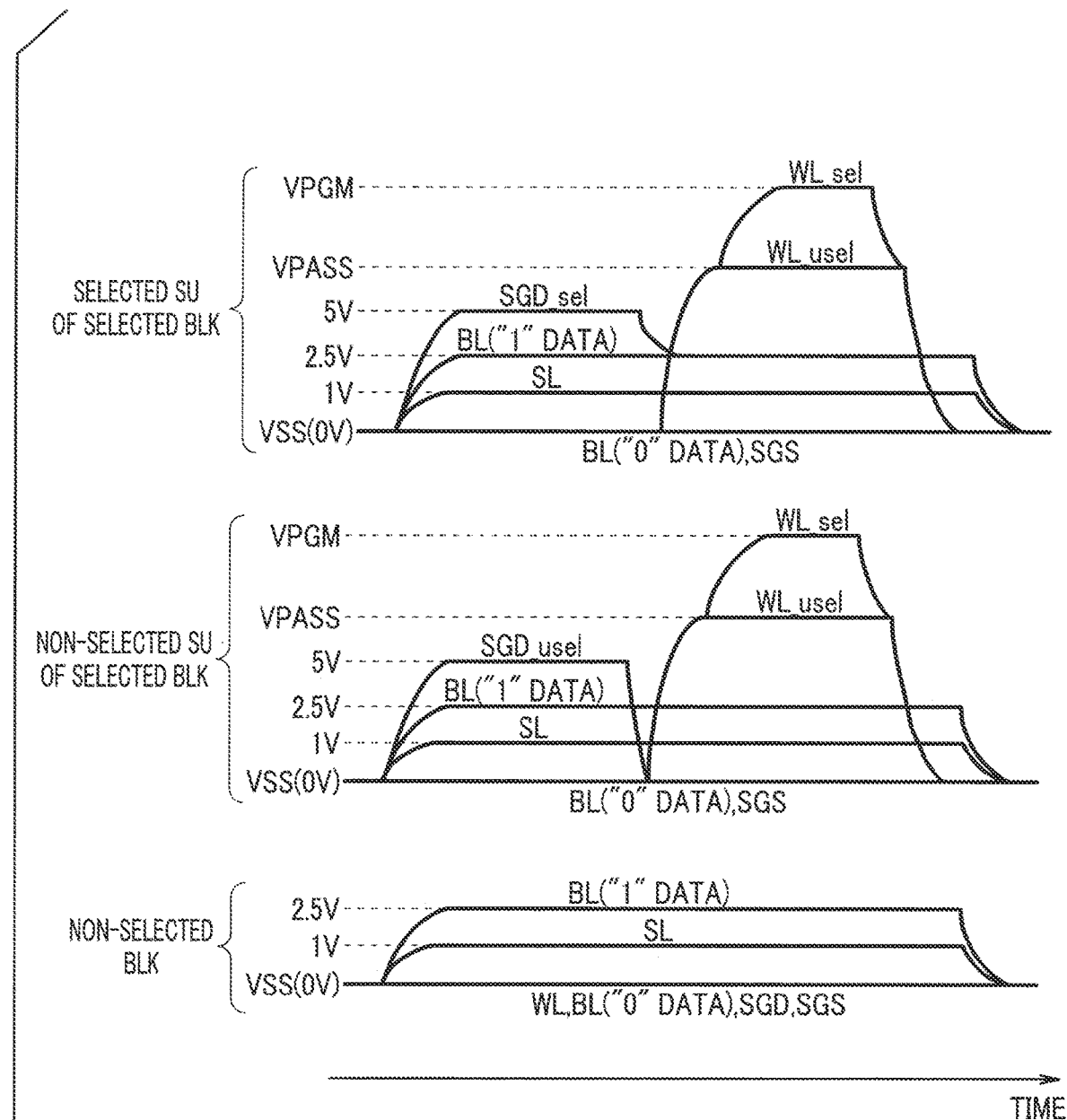
FIG. 7A is a diagram illustrating potential change at each wire in program operation.

FIG. 7A is a diagram illustrating potential change at each wire in the write operation (program operation). Note that each voltage illustrated in FIG. 7A is generated by the voltage supply circuit 28 being controlled by the sequencer 27.

The program operation is performed in accordance with the program voltage and the bit line voltage applied to a word line and a bit line. For a writing target string unit SU (selected SU) of a writing target block BLK (selected BLK), the select gate line SGD (SGD_sel) is set to, for example, 5 V to conduct electricity through the select gate transistor ST1 before application of the program voltage VPGM. In the program operation, the select gate line SGS is at, for example, 0 V. Thus, the select gate transistor ST2 is off. Thereafter, the select gate line SGD (SGD_sel) is set to, for example 2.5 V at application of the program voltage VPGM. Accordingly, a state of conduction or non-conduction through the select gate transistor ST1 is determined by the bit line voltage of the bit line BL connected to the select gate transistor ST1.

For a non-writing target string unit SU (non-selected SU) of a writing target block BLK (selected BLK), the select gate line SGD (SGD_usel) is set to, for example, 5 V to conduct electricity through the select gate transistor ST1 before application of the program voltage VPGM. Thereafter, the select gate line SGD (SGD_usel) is set to, for example, 0 V at application of the program voltage VPGM. Accordingly, the select gate transistor ST1 conducts no electricity and is electrically disconnected from the bit line BL.

Note that, in a non-writing target block BLK (non-selected BLK), "0" is applied to each select gate line SGD and the select gate line SGS. Accordingly, each select gate transistor ST1 and each select gate transistor ST2 are turned off.

As described above, the sense amplifier 24 forwards data to each bit line BL. The ground voltage Vss of, for example, 0 V is applied as bit line voltage Vbl_L to a bit line BL provided with data "0". Writing inhibition voltage Vinhibit (for example, 2.5 V) is applied as bit line voltage Vbl_H to a bit line BL provided with data "1". Thus, at application of the program voltage VPGM, the select gate transistor ST1 connected to the bit line BL provided with data "0" conducts electricity and the select gate transistor ST1 connected to the bit line BL provided with data "1" is cut off. Each memory cell transistor MT connected to the select gate transistor ST1 being cut off is set to writing inhibition.

In each memory cell transistor MT connected to the select gate transistor ST1 set to a conducting state, electrons are injected into the electric charge accumulation film in accordance with voltage applied to the corresponding word line WL. A memory cell transistor MT connected to a word line WL provided with voltage VPASS as word line voltage becomes a conducting state irrespective of the threshold voltage, but no electrons are injected into the electric charge accumulation film. In a memory cell transistor MT connected to a word line WL provided with the program voltage VPGM as word line voltage, electrons are injected into the electric charge accumulation film in accordance with the program voltage VPGM.

Figure 8:
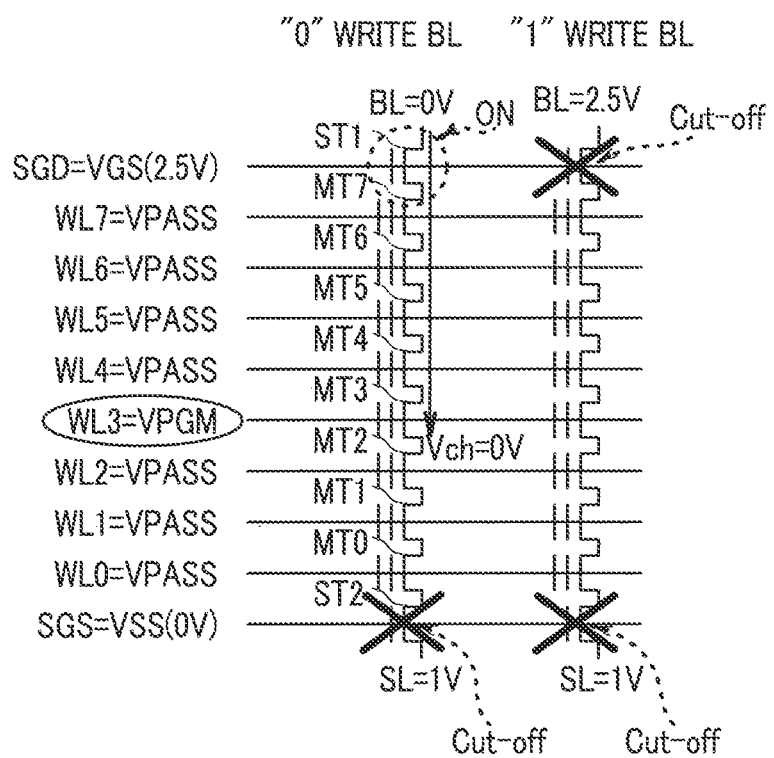
FIG. 8 is a circuit diagram illustrating a status of strings in the program operation.

In other words, the row decoder 25 selects either word line WL in a selected block BLK, applies the program voltage VPGM to the selected word line, and applies the voltage VPASS to any other word line (non-selected word line) WL. The program voltage VPGM is high voltage for injecting electrons into the electric charge accumulation film by a tunneling phenomenon, and VPGM>VPASS holds. FIG. 8 illustrates a status of a string unit SU in this case.

FIG. 8 is a circuit diagram illustrating a status of strings in the program operation. FIG. 8 illustrates two NAND strings corresponding to a "0" writing target bit line BL and a "1" writing target bit line BL. FIG. 8 illustrates a status when the word line WL3 is selected.

As illustrated in FIG. 8, the voltage VPGM is applied to the selected word line WL3, and the voltage VPASS is applied to the non-selected word lines WL0 to WL2 and WL4 to WL7.

Accordingly, in the NAND string corresponding to the "0" writing target bit line BL, the select gate transistor ST1 is turned on. Thus, channel potential Vch of the memory cell transistor MT3 connected to the selected word line WL3 becomes 0 V. In other words, a potential difference between a control gate and a channel increases, and as a result, electrons are injected into the electric charge accumulation layer and the threshold voltage of the memory cell transistor MT3 is increased.

In the NAND string corresponding to the "1" writing target bit line BL, the select gate transistor ST1 is cut off. Thus, the channel of the memory cell transistor MT3 connected to the selected word line WL3 becomes electrically floating, and the channel potential Vch is increased close to the voltage VPGM due to capacitive coupling with the word line WL and the like. In other words, the potential difference between the control gate and the channel decreases, and as a result, no electrons are injected into the electric charge accumulation layer and the threshold voltage of the memory cell transistor MT3 is maintained (the threshold voltage does not vary enough to cause transition of a threshold voltage distribution level to a higher distribution).

In this manner, the write operation (program operation) is performed on each memory cell transistor MT in the memory cell array 23 as data is supplied to the corresponding bit line BL by the sense amplifier 24 while voltage of the corresponding word line WL is controlled by the row decoder 25.

Figure 7B:
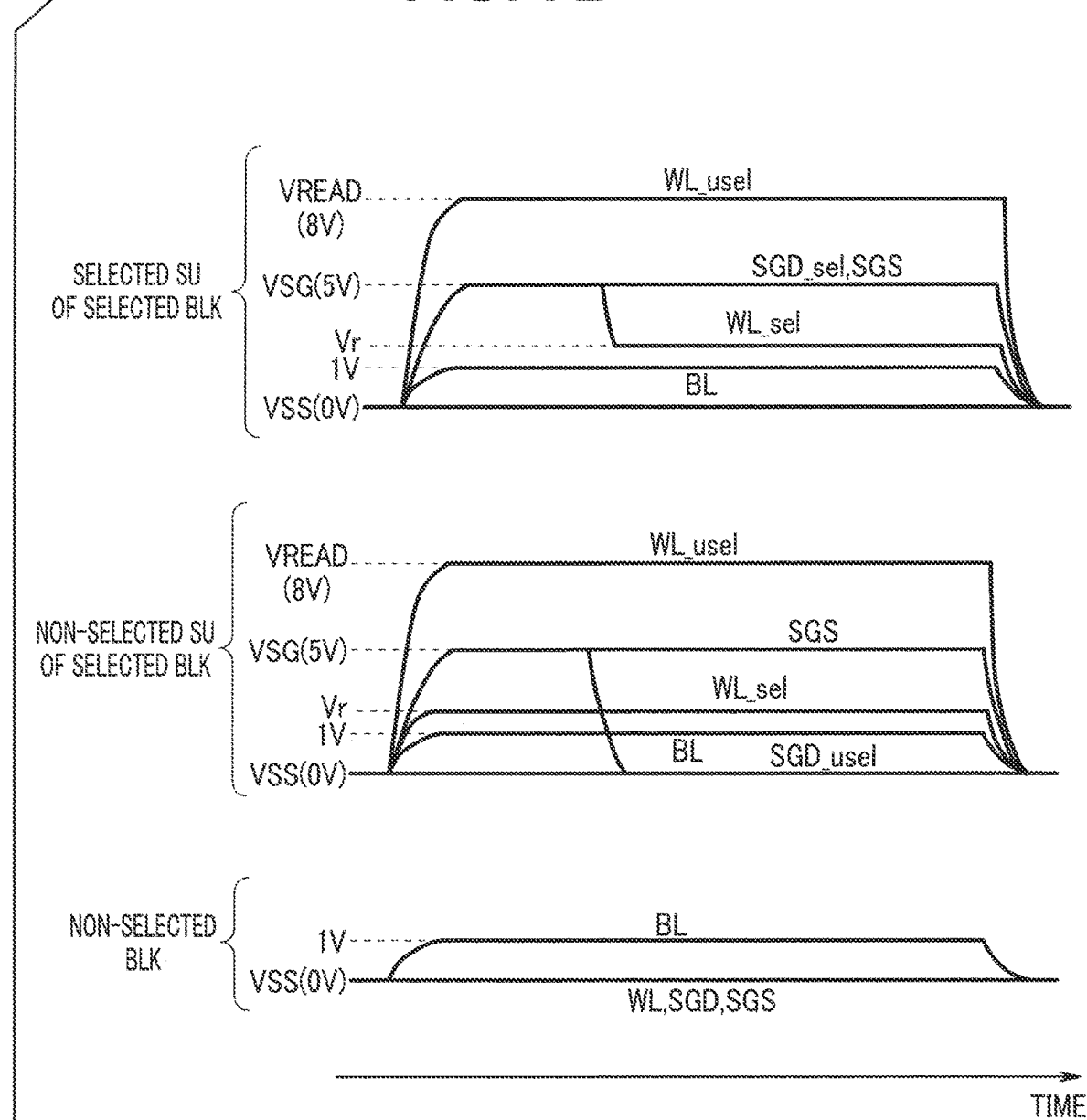
FIG. 7B is a diagram illustrating potential change at each wire in verify operation.

FIG. 7B is a diagram illustrating potential change at each wire in the read operation (verify operation). Note that each voltage illustrated in FIG. 7B is generated by the voltage supply circuit 28 being controlled by the sequencer 27.

The verify operation, that is, data reading from a multi-valued memory cell transistor is performed as the row decoder 25 applies the reading voltage to a selected word line WL (hereinafter also referred to as WL_sel) and the sense amplifier 24 senses data read by a bit line BL and determines whether the read data is "0" or "1". Note that, for conduction through memory cell transistors connected to a non-selected word line WL (hereinafter also referred to as WL_usel), the row decoder 25 provides, to the non-selected word line WL_usel, sufficiently high voltage VREAD that is necessary for turning on each memory cell transistor. Note that any adjacent word line may be provided with voltage VREADK that is slightly higher than the voltage VREAD to facilitate conduction through memory cell transistors connected to the adjacent word line.

The row decoder 25 applies voltage VSG for turning on the select gate transistor ST1 to the select gate line SGD (hereinafter also referred to as SGD_sel) included in a reading target string unit (selected string unit) among string units SU, and applies voltage Vss (for example, 0 V) for turning off the select gate transistor ST1 to the select gate line SGD (hereinafter also referred to as a non-select gate line SGD_usel) included in a non-reading target string unit (non-selected string unit). Note that, after the voltage VSG for turning on the select gate transistor ST1 is applied to the non-select gate line SGD_usel, the voltage Vss for turning off the select gate transistor ST1 may be applied.

The row decoder 25 applies the reading voltage to the selected word line WL_sel and applies the voltage VREAD or VREADK to the non-selected word line WL_usel. In the read operation, the sense amplifier 24 fixes a bit line BL to constant voltage (for example, 1 V) and charges a sense node SEN (not illustrated) inside the sense amplifier unit group 24A to predetermined precharge voltage Vpre higher than the voltage of the bit line BL. In this state, the logic control circuit 21 connects the sense node SEN to the bit line BL. Accordingly, current flows from the sense node SEN to the bit line BL, and the voltage of the sense node SEN gradually decreases.

The voltage of the sense node SEN changes in accordance with a state of the threshold voltage of each memory cell transistor connected to the corresponding bit line BL. In other words, when the threshold voltage of the memory cell transistor is lower than the reading voltage, the memory cell transistor is on, large cell current flows to the memory cell transistor, and the voltage of the sense node SEN decreases at high speed. When the threshold voltage of the memory cell transistor is higher than the reading voltage, the memory cell transistor is off, small or no cell current flows to the memory cell transistor, and the voltage of the sense node SEN decreases at slow speed.

Such a difference in the speed of decrease of the voltage of the sense node SEN is used to determine a writing state of the memory cell transistor, and a result thereof is stored in a data latch circuit. For example, whether the voltage of the sense node SEN is at a low level (hereinafter also referred to as "L") or a high level (hereinafter also referred to as "H") is determined at a first timing when a predetermined first duration elapses since electrical discharging start at which electric charge at the sense node SEN starts discharging. For example, when the threshold voltage of the memory cell transistor is lower than the reading voltage, the memory cell transistor is completely on and large cell current flows through the memory cell transistor. Accordingly, the voltage of the sense node SEN rapidly decreases, a voltage decrease amount is relatively large, and the sense node SEN becomes "L" at the first timing.

When the threshold voltage of the memory cell transistor is higher than the reading voltage, the memory cell transistor is off, extremely small or no cell current flows through the memory cell transistor. Accordingly, the voltage of the sense node SEN extremely gradually decreases, the voltage decrease amount is relatively small, and the sense node SEN remains at "H" at the first timing.

In this manner, whether the threshold voltage of the memory cell transistor is higher or lower than the reading voltage is determined as a state of the sense node SEN is monitored by the sense amplifier circuit while the reading voltage is applied to the selected word line WL_sel by the row decoder 25. Thus, when voltage between levels is applied to the selected word line WL_sel as reading voltage, a level of each memory cell transistor can be determined and data allocated to the level can be read.

For example, 3-bit data per memory cell transistor can be stored in a TLC by allocating data to each of the threshold voltage distributions of eight lobes of the TLC. Writing is performed to each memory cell transistor at any of the levels Er, A, B, . . . , and G corresponding to the eight threshold voltage distributions, respectively. At reading, the value of data in each memory cell transistor can be determined by applying the voltages VrA to VrG. Note that, in the following description, the reading voltage applied to the selected word line WL_sel in the verify operation is referred to as voltages VfyA to VfyG.

(2-2. Specific Example of Write Operation)

Description of the write operation of the present embodiment will be first more specifically made on a standard write sequence with reference to FIG. 9. FIG. 9 illustrates an example in which data is written as combination of the program operation and the verify operation is repeated 19 times. This repetition operation is referred to as "loop".

FIG. 9 lists a target level of the verify operation performed in each loop. As illustrated in FIG. 9, the verify operation is performed only for level "A" in the first and second loops. Specifically, in the verify operation, the voltage VfyA is applied to the selected word line WL_sel, but the voltages VfyB to VfyG are not applied. In the subsequently third and fourth loops, the verify operation is performed for level "A" and level "B". Specifically, in the verify operation, the voltages VfyA and VfyB are sequentially applied to the selected word line WL_sel, but the voltages VfyC to VfyG are not applied.

In the fifth and sixth loops, the verify operation is performed for level "A", level "B", and level "C". Specifically, in the verify operation, the voltages VfyA, VfyB, and VfyC are sequentially applied to the selected word line WL_sel, but the voltages VfyD to VfyG are not applied. The verify operation for level "A" is completed on the sixth loop. This is because it is empirically known that, for example, programming to level "A" is substantially completed in six loops.

In the seventh and eighth loops, the verify operation is performed for level "B", level "C", and level "D". Specifically, in the verify operation, the voltages VfyB, VfyC, and VfyD are sequentially applied to the selected word line WL_sel. The verify operation for level "B" is completed on the eighth write operation. Further, in the ninth and tenth loops, the verify operation is performed for level "C", level "D", and level "E". Specifically, in the verify operation, the voltages VfyC, VfyD, and VfyE are sequentially applied to the selected word line WL_sel. The verify operation for level "C" is completed on the tenth loop. Subsequently, writing is similarly performed up to level "G", and 19 loops are repeated at maximum.

Figure 10:
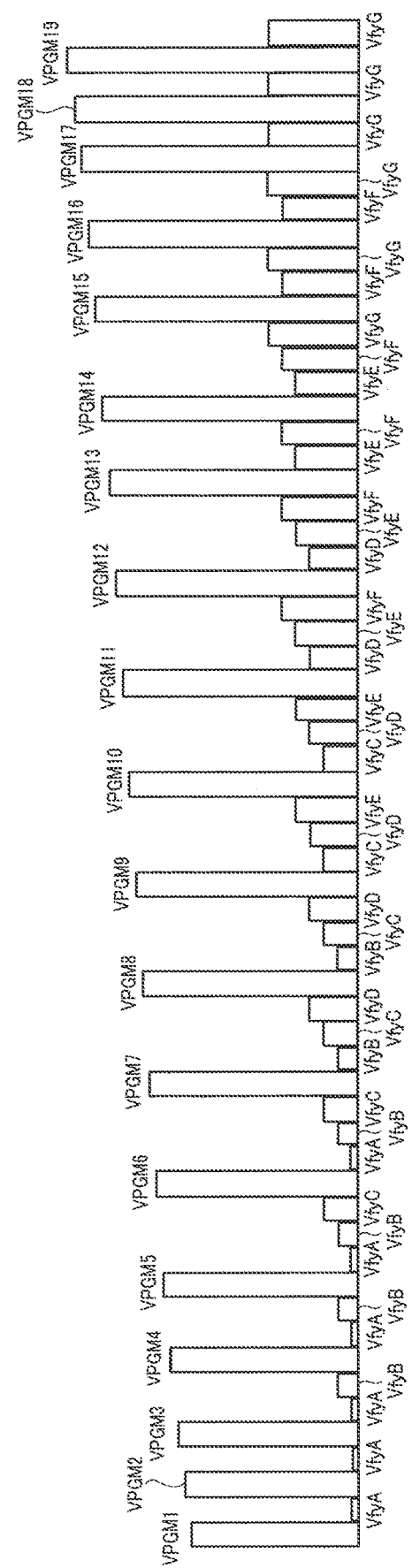
FIG. 10 is a diagram illustrating timings of the program operation and the verify operation in the write operation based on the standard write sequence.

FIG. 10 is a diagram illustrating timings of the program operation and the verify operation in the write operation based on the standard write sequence described above. As illustrated in FIG. 10, in the first and second loops, the verify operation is performed only for level "A". Specifically, the verify operation is performed once for each program operation. In the third and fourth loops, the verify operation is performed for level "A" and level "B". Specifically, the verify operation is performed twice for each program operation. In the fifth loop to the twelfth loop on which the verify operation for level "D" is completed, the verify operation is performed three times for each program operation. Subsequently, the verify operation for each set predetermined level is performed for each program operation. Eventually in the 19 loops, the program operation is performed 19 times and the verify operation is performed 42 times.

Note that the above description assumes that the verify operation is performed up to an upper limit number of times. As illustrated in FIG. 9, the verify operation for level "A" is executed six times at maximum through the first to sixth loops. The verify operation for level "B" is executed six times at maximum through the third to eighth loops. This is same for the other levels. For example, there are a plurality of memory cell transistors MT written at level "A" and a plurality of bit lines BL ("A") connected to the memory cell transistors MT. Thus, in a precise sense, for example, when all memory cell transistors MT written at level "A" have passed the verify operation for level "A" in the fifth loop, the verify operation is not executed for each bit line BL ("A") in the sixth loop in some cases. This is also true for the following description.

The voltage VPGM applied to the selected word line WL_sel through the program operation for the first time, an increase amount of the voltage VPGM in the program operation for the second time or later, and a loop at which the verify operation for each level starts are set based on an assumption of a worst case of fast writing, and sufficient margins are allocated to prevent writing beyond a target level.

The number of loops in the write operation, the voltage (voltage VPGM) of the selected word line WL_sel at each loop, and a verify operation target level in each loop, which are described above, are stored as the standard write sequence in the sequencer 27. When the write operation is to be executed on the memory cell array 23 based on the standard write sequence, the sequencer 27 outputs a control signal based on the standard write sequence to the sense amplifier 24 and the row decoder 25.

Figure 11:
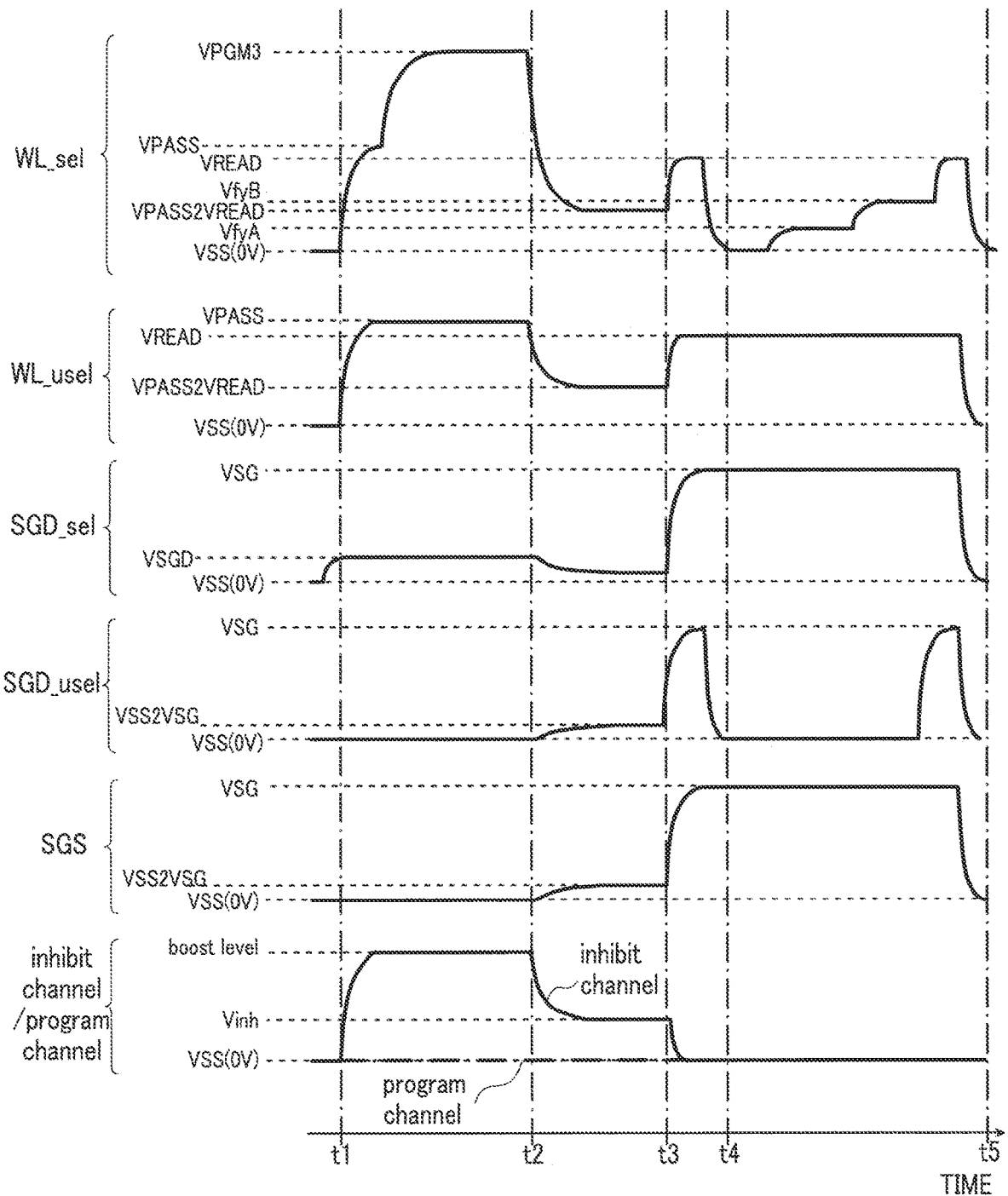
FIG. 11 is a diagram illustrating potential change at each wire in the write operation.

Subsequently, potential change at each wire in the write operation (the program operation and the verify operation) will be described below. FIG. 11 is a diagram illustrating potential change at each wire in the write operation. FIG. 11 illustrates potential change at each wire in, for example, the third loop. FIG. 11 also illustrates channel potential (corresponding to a solid line; hereinafter also referred to as inhibit channel potential) of the NAND string corresponding to the "1" writing target bit line BL, and channel potential (corresponding to a dashed and single-dotted line; hereinafter also referred to as program channel potential) of the NAND string corresponding to the "0" writing target bit line BL. In FIG. 11, the write operation is performed in a duration from time point t1 to time point t5. The program operation is performed in a duration from time point t1 to time point t3. The verify operation is performed in a duration from time point t3 to time point t5.

The program operation has an actual program duration (time point t1 to time point t2) and a duration of transition to the verify operation (time point t2 to time point t3; hereinafter referred to as a VPASS2VREAD duration). The actual program duration is a duration in which operation that increases the threshold voltage of a memory cell transistor MT is performed (or the threshold voltage is maintained by inhibiting injection). In other words, potential of each wire is set and changed in accordance with the potential change illustrated in FIG. 7A. The voltage VPASS (for example, 10 V) is applied to the non-selected word line WL_usel, and program voltage VPGM3 (for example, 13 V) for the third loop is applied to the selected word line WL_sel. In addition, voltage VSGD (for example, 2.5 V) is applied to the select gate line SGD_sel, and the voltage Vss is applied to the non-select gate lines SGD_usel and SGS. Note that, in FIG. 11, a first-half part of the potential change illustrated in FIG. 7A is omitted, and only a second-half part thereof is illustrated.

In the actual program duration, the select gate transistors ST1 and ST2 of the NAND string corresponding to the "1" writing target bit line BL are both cut off. Thus, the inhibit channel potential as the channel potential of the NAND string is boosted by capacitive coupling between the selected word line WL_sel and an inhibit channel and capacitive coupling between the non-selected word line WL_usel and the inhibit channel. Note that a boost level obeys Expression (1) below.

$$\text{The inhibit channel potential} = V\text{int} + \alpha(\text{VPGM} + (\text{VPASS} \times \text{the number of non-selected word lines WL\_usel}) - (V\text{tcell} \times \text{the number of word lines WL})) \quad (1)$$

In Expression (1), Vint represents voltage initially applied to the channel, and Vtcell represents the threshold voltage of the cell.

The VPASS2VREAD duration is a duration in which the voltage of the selected word line WL_sel and the voltage of the non-selected word line WL_usel are electrically discharged before the verify operation. Conventionally, in the VPASS2VREAD duration, the voltage of the selected word line WL_sel and the voltage of the non-selected word line WL_usel have been electrically discharged down to the ground voltage Vss (for example, 0 V). However, in an example illustrated in FIG. 11, the voltage of the selected word line WL_sel and the voltage of the non-selected word line WL_usel are electrically discharged only to voltage VPASS2VREAD. The voltage VPASS2VREAD is set to voltage that is higher than the ground voltage Vss and lower than voltage (in the example illustrated in FIG. 11, the voltage VREAD) first charged to each word line WL in the verify operation. The voltage VPASS2VREAD is set to be, for example, 3 to 6 V approximately. Since the voltage of the selected word line WL_sel and the voltage of the non-selected word line WL_usel are electrically discharged only to the voltage VPASS2VREAD, an amount of current flowing out of each word line WL can be reduced, and thus efficiency of the operation can be improved. As the voltage of the selected word line WL_sel decreases, the inhibit channel potential decreases to a value (Vinh) lower than the voltage VPASS2VREAD.

Note that, in FIG. 11, voltage VSS2VSG of the select gate lines SGD_sel, SGD_usel, and SGS in the VPASS2VREAD duration is voltage (for example, 1 V) approximately higher than the voltage Vss and lower than the voltage VSGD (voltage applied to the select gate line SGD_sel in the program duration; for example, 2.5 V), but this voltage level is not limited thereto. The voltage VSS2VSG may be, for example, the voltage Vss or another particular voltage level.

The verify operation has a disturbance prevention duration (time point t3 to time point t4; hereinafter referred to as an USTRDIS duration) and an actual verify duration (time point t4 to time point t5). In the USTRDIS duration, all-channel conduction is performed at actual verify operation start to prevent disturbance (unintended increase of the threshold voltage). In other words, when a cell belonging to the selected word line WL_sel is not turned on in a non-selected string, potential on a drain side is boosted and potential on a source side becomes equal to VCELSRC, and accordingly, a large potential difference occurs. In this case, such a phenomenon occurs that hot carrier injection (HCI) occurs and a threshold value of a cell nearby changes. As a countermeasure for this, the non-select gate line SGD_usel on the drain side in the non-selected string is turned on to remove the boosted potential, thereby preventing potential difference between the drain side and the source side. Accordingly, unintended increase of the threshold voltage is prevented. The voltage VSG (for example, 5 V) for turning on the select gate transistors ST1 and ST2 is applied to the select gate lines SGD_sel, SGD_usel, and SGS. The sufficiently high voltage VREAD (for example, 8 V) that is necessary for turning on each memory cell transistor is applied to each of the selected word line WL_sel and the non-selected word line WL_usel.

In the actual verify duration, the select gate lines SGD_sel and SGS are maintained at the voltage VSG (for example, 5 V). The non-select gate line SGD_usel decreases to the voltage Vss (for example, 0 V) for turning off the select gate transistor ST1. In the actual verify duration, the non-selected word line WL_usel is maintained at the voltage VREAD. The selected word line WL_sel changes to the voltages VfyA and VfyB for reading at level "A" and level "B". The select gate transistors ST2 of all NAND strings are on through an entire duration of the verify operation. Thus, the inhibit channel potential is 0 V.

(2-3. Control of Voltage of Each Wire in Write Operation)

Figure 12:
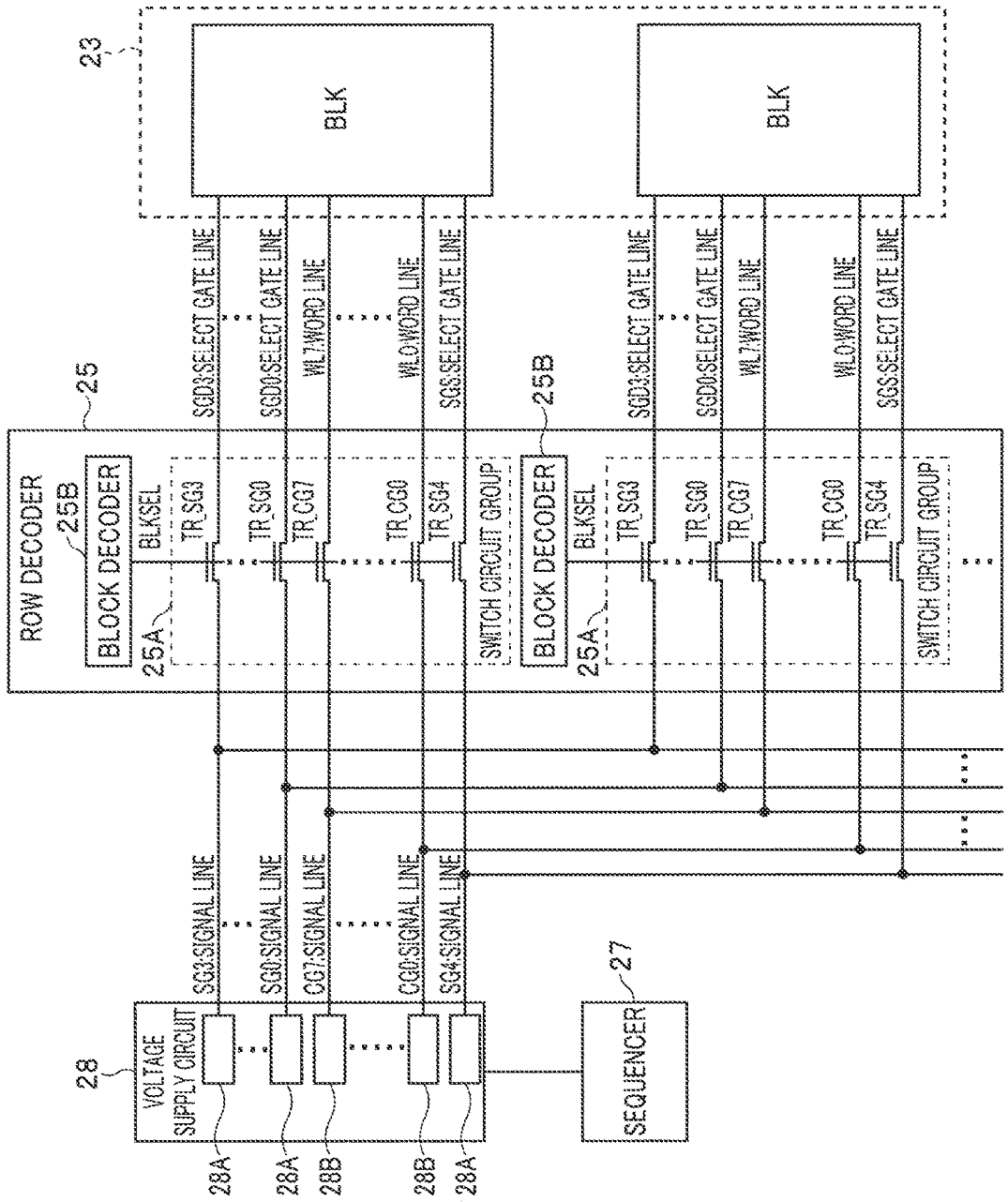
FIG. 12 is a block diagram illustrating an example of configurations of a voltage supply circuit 28 and a row decoder 25.

Subsequently, generation and control of voltage applied to each wire in the write operation will be described below with reference to FIGS. 12 to 17. FIG. 12 is a block diagram illustrating an example of configurations of the voltage supply circuit 28 and the row decoder 25. Note that FIG. 12 illustrates only a configuration of part of the voltage supply circuit 28.

In FIG. 12, the voltage supply circuit 28 generates various voltages including voltages necessary for, for example, the program operation and the read operation on memory cell transistors MT. The voltage supply circuit 28 includes an SG driver 28A configured to supply voltage to each of signal lines SG0 to SG4, and a plurality of CG drivers 28B configured to supply voltage to signal lines CG0 to CG7, respectively. The signal lines SG0 to SG4 and CG0 to CG7 are bifurcated through the row decoder 25 and connected to wires of each block BLK. In other words, the signal lines SG0 to SG3 function as global drain side select gate lines and are connected to the select gate lines SGD0 to SGD3 as local select gate lines in each block BLK through the row decoder 25. The signal lines CG0 to CG7 function as global word lines and are connected to the word lines WL0 to WL7 as local word lines in each block BLK through the row decoder 25. The signal line SG4 functions as a global source side select gate line and is connected to the select gate line SGS as a local select gate line in each block BLK through the row decoder 25.

The voltage supply circuit 28 generates various voltages under control of the sequencer 27. The SG drivers (select gate line drivers) 28A and the CG drivers (word line drivers) 28B supply the various generated voltages to the signal lines SG0 to SG4 and CG0 to CG7, respectively.

The row decoder 25 includes a plurality of switch circuit groups 25A corresponding to respective blocks, and a plurality of block decoders 25B provided for the plurality of switch circuit groups 25A, respectively. Each switch circuit group 25A includes a plurality of transistors TR_SG0 to TR_SG4 connecting the signal lines SG0 to SG4 and the select gate line SGD0 to SGD4, respectively, and a plurality of transistors TR_CG0 to TR_CG7 connecting the signal lines CG0 to CG7 and the word lines WL0 to WL7, respectively. The transistors TR_SG0 to TR_SG4 and the transistors TR_CG0 to TR_CG7 are each a high-voltage transistor.

When specified by a row address, each block decoder 25B supplies a block selection signal BLKSEL to gates of the transistors TR_SG0 to TR_SG4 and TR_CG0 to TR_CG7. Accordingly, in a switch circuit group 25A to which the block selection signal BLKSEL is supplied from the block decoder 25B specified by the row address, the transistors TR_SG0 to TR_SG4 and TR_CG0 to TR_CG7 are turned on and conduct electricity. As a result, the voltages supplied from the voltage supply circuit 28 to the signal lines SG0 to SG4 and CG0 to CG7 are supplied to the select gate lines SGD0 to SGD3 and SGS and the word lines WL0 to WL7 included in the corresponding block BLK as an operation target.

In other words, the voltage supply circuit 28 and the row decoder 25 supply the voltage VPGM, VCGRV, and the like to a selected word line WL, and supply the voltage VREAD, VREADK, or the like to a non-selected word line WL. For example, the voltage VSGD is supplied to a select gate line SGD (SGD_sel) connected to a select gate transistor ST1 belonging to a string unit SU as an operation target, and the voltage Vss such as 0 V is supplied to a select gate line SGD (SGD_usel) connected to a select gate transistor ST1 not belonging to the string unit SU as an operation target.

Figure 13:
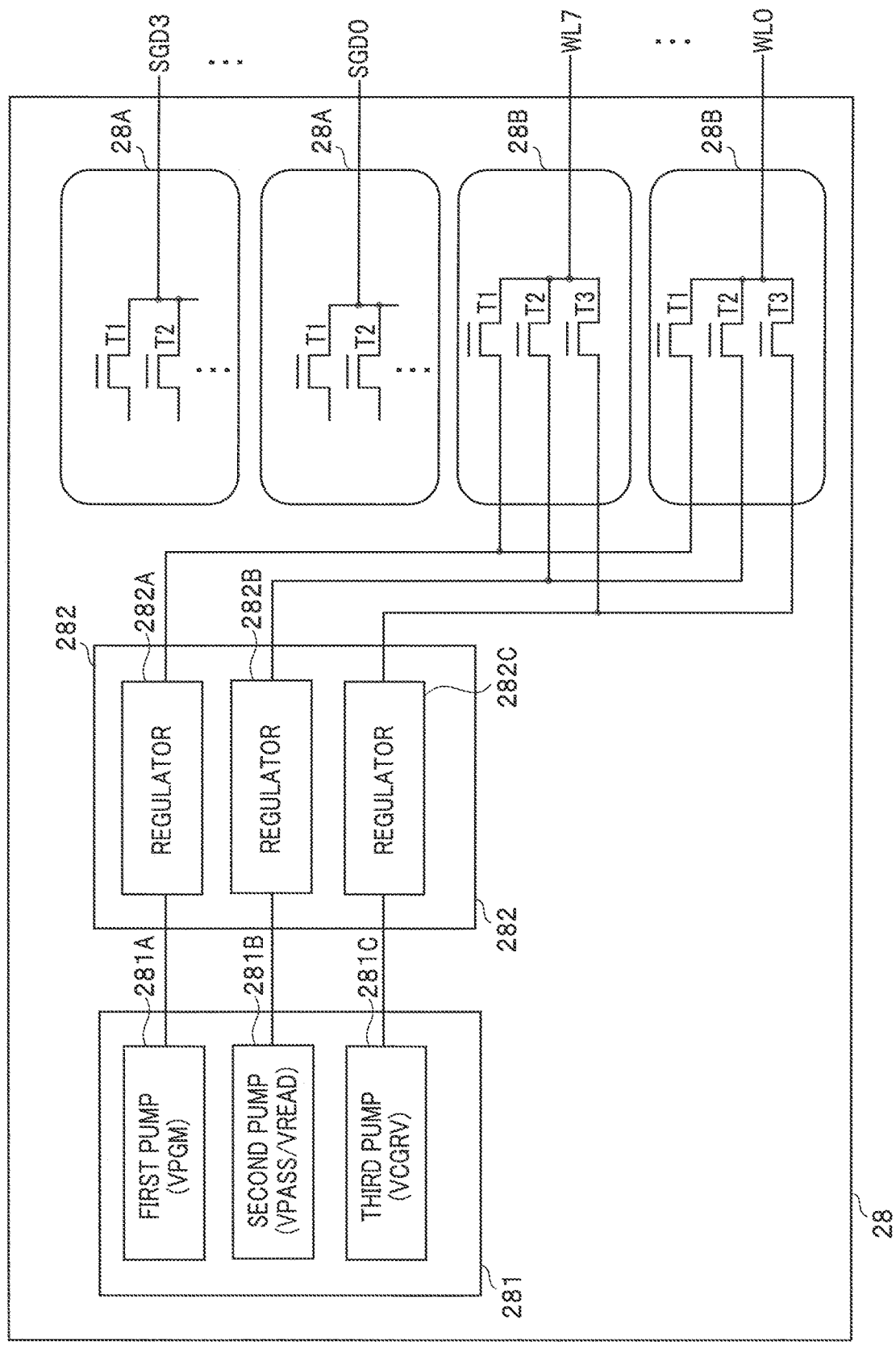
FIG. 13 is a block diagram illustrating an example of a specific configuration of the voltage supply circuit 28.

FIG. 13 is a block diagram illustrating an example of a specific configuration of the voltage supply circuit 28. The voltage supply circuit 28 includes a voltage generation circuit 281, a regulator circuit 282, the SG drivers 28A, and the CG drivers 28B. Subsequently, a circuit configured to generate various voltages necessary for operation of the word lines WL will be described below in detail.

The voltage generation circuit 281 generates, by using voltage input from the power source inputting terminal group 35, various voltages necessary for operation at sites of the non-volatile memory 2. The voltage generation circuit 281 includes a first pump 281A, a second pump 281B, and a third pump 281C. The first pump 281A generates the voltage VPGM as program voltage. The second pump 281B generates the voltages VPASS, VREAD, and VPASS2VREAD. The third pump 281C generates the voltage VCGRV as verify voltage.

A regulator circuit 282 generates, by using voltage input from the voltage generation circuit 281, voltage of a constant value even when the values of input voltage and output current vary. The regulator circuit 282 includes three regulators 282A to 282C. The regulator 282A generates the voltage VPGM by using voltage input from the first pump 281A. The regulator 282B generates any of the voltages VPASS, VREAD, and VPASS2VREAD by using voltage input from the second pump 281B. The regulator 282C generates the voltage VCGRV by using voltage input from the third pump 281C. The voltages generated by the regulators 282A to 282C are input to each CG driver 28B.

Each CG driver 28B includes a plurality of input ends to which a plurality of kinds of input voltages are input, and a plurality of kinds of voltages can be input from the regulator circuit 282 through the input ends. The input ends of the CG driver 28B are connected to one output end through switches T1, T2, and T3 disposed on supply paths of the plurality of respective kinds of voltages. When any one of the switches T1, T2, and T3 is selected and turned on, voltage provided to a supply path connected to the selected switch appears at the output end.

In other words, voltage input from the regulator 282A is supplied to the output end through the switch T1. Voltage input from the regulator 282B is supplied to the output end through the switch T2. Voltage input from the regulator 282C is supplied to the output end through the switch T3.

Note that, similarly to the CG driver 28B, each SG driver 28A includes a plurality of input ends to which a plurality of kinds of input voltages are input, and a plurality of kinds of voltages can be input from the regulator circuit 282 through the input ends. The input ends of the SG driver 28A are connected to one output end through switches T1, T2, . . . disposed on supply paths of the plurality of respective kinds of voltages. When any one of the switches T1, T2, . . . is selected and turned on, voltage provided to a supply path connected to the selected switch appears at the output end.

Operation of each site of the voltage supply circuit 28 is controlled by the sequencer 27. For example, selection of a switch to be turned on among the switches T1, T2, and T3, the voltages generated by the pumps 281A to 281C of the voltage generation circuit 281, and values of voltages generated by the regulators 282A to 282C of the regulator circuit 282 are controlled by the sequencer 27.

Figure 14A:
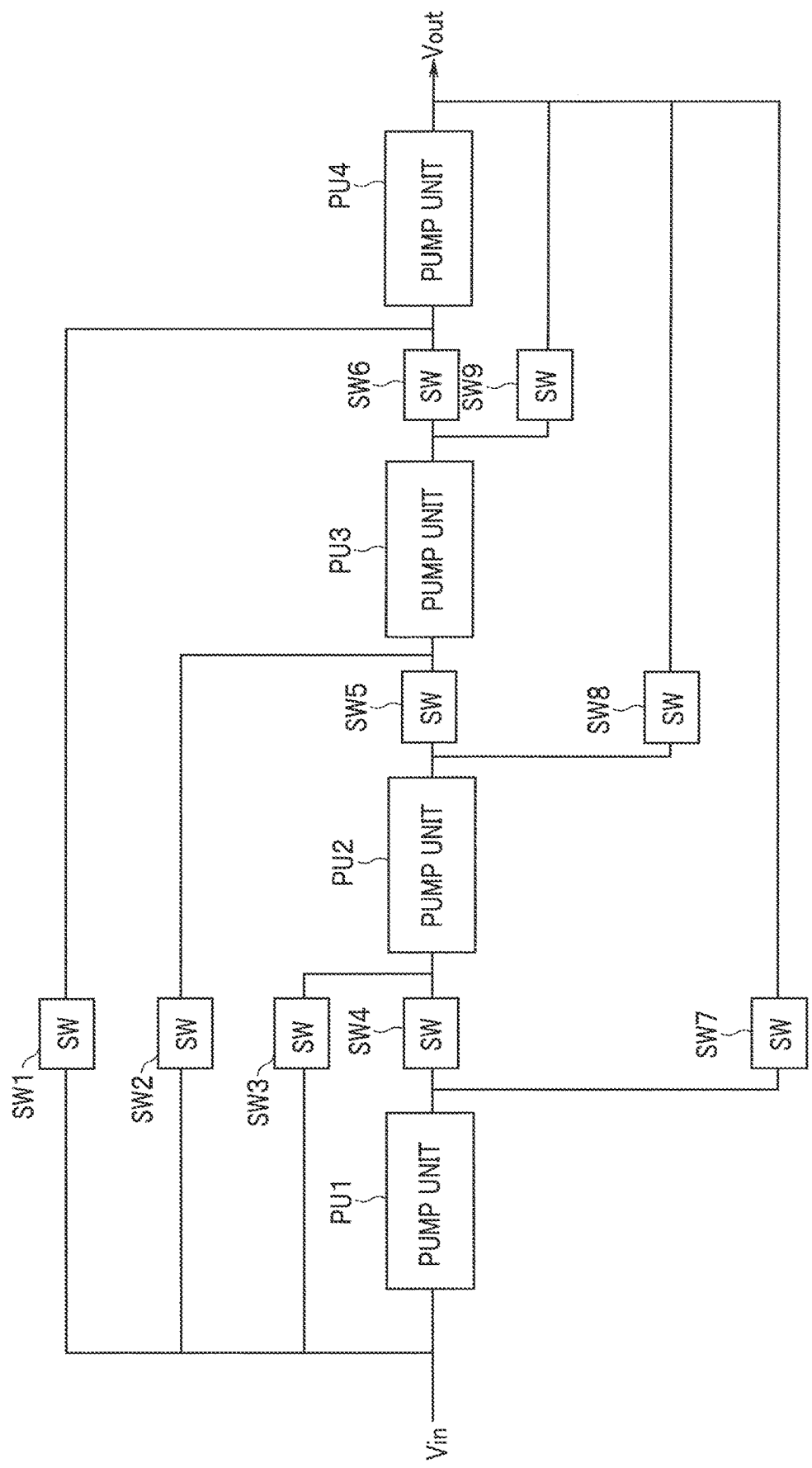
FIG. 14A is a block diagram illustrating an example of a specific configuration of pump units.

FIG. 14A is a block diagram illustrating an example of a specific configuration of the second pump 281B. The second pump 281B includes, for example, four pump units PU1 to PU4 and nine switch circuits SW1 to SW9. The pump units PU1 to PU4 are each configured as, for example, a charge pump circuit as illustrated in FIG. 15.

Figure 15:
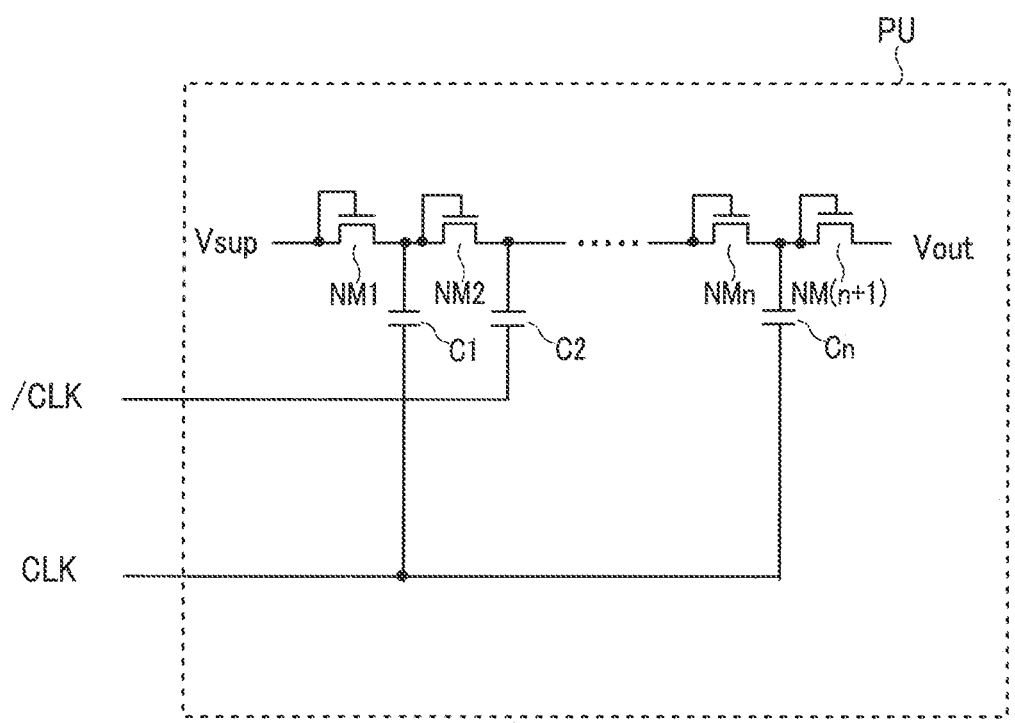
FIG. 15 is a diagram illustrating an example of a charge pump circuit.

FIG. 15 is a diagram illustrating an example of the charge pump circuit. The charge pump circuit configured as a pump unit PU includes n+1 NMOS transistors NM1 to NM(n+1) and n capacitors C1 to Cn. The NMOS transistors NM1 to NM(n+1) are each diode-connected and function as a diode. Current paths of the NMOS transistors NM1 to NM(n+1) are sequentially connected in series.

One ends of the capacitors C1 to Cn are electrically connected to one ends of the NMOS transistors NM1 to NMn, respectively. A clock signal CLK is supplied to the other end of each of the capacitors C1, C3, . . . , C(2m−1) connected to odd-numbered NMOS transistors NM(2m−1) (m=1, 2, . . . ) such as the NMOS transistor NM1, NM3, . . . . A clock signal /CLK is supplied to the other end of each of the capacitors C2, C4, . . . , C(2m) connected to even-numbered NMOS transistors NM(2m) such as the NMOS transistors NM2, NM4, . . . . Voltage Vsup (for example, the power voltage Vcc) is input to the other end of the NMOS transistor NM1. The capacitors C1 to Cn repeat charging and discharging in accordance with the clock signals CLK and /CLK. As a result, output voltage Vout higher than the voltage Vsup is generated and forwarded (output) from one end of the NMOS transistor NM(n+1).

Figure 14B:
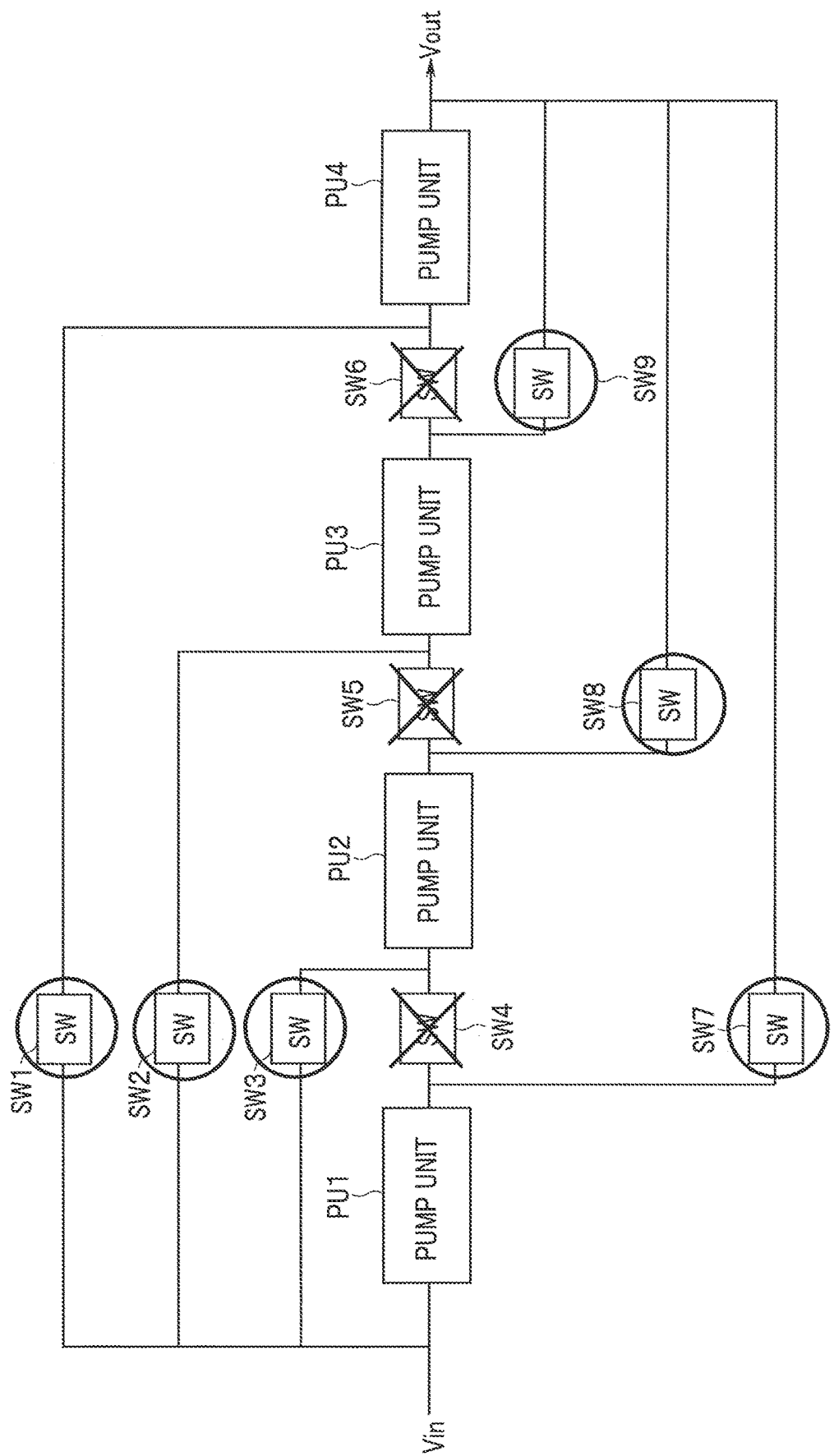
FIG. 14B is a block diagram for description of a configuration of a first state.
Figure 14C:
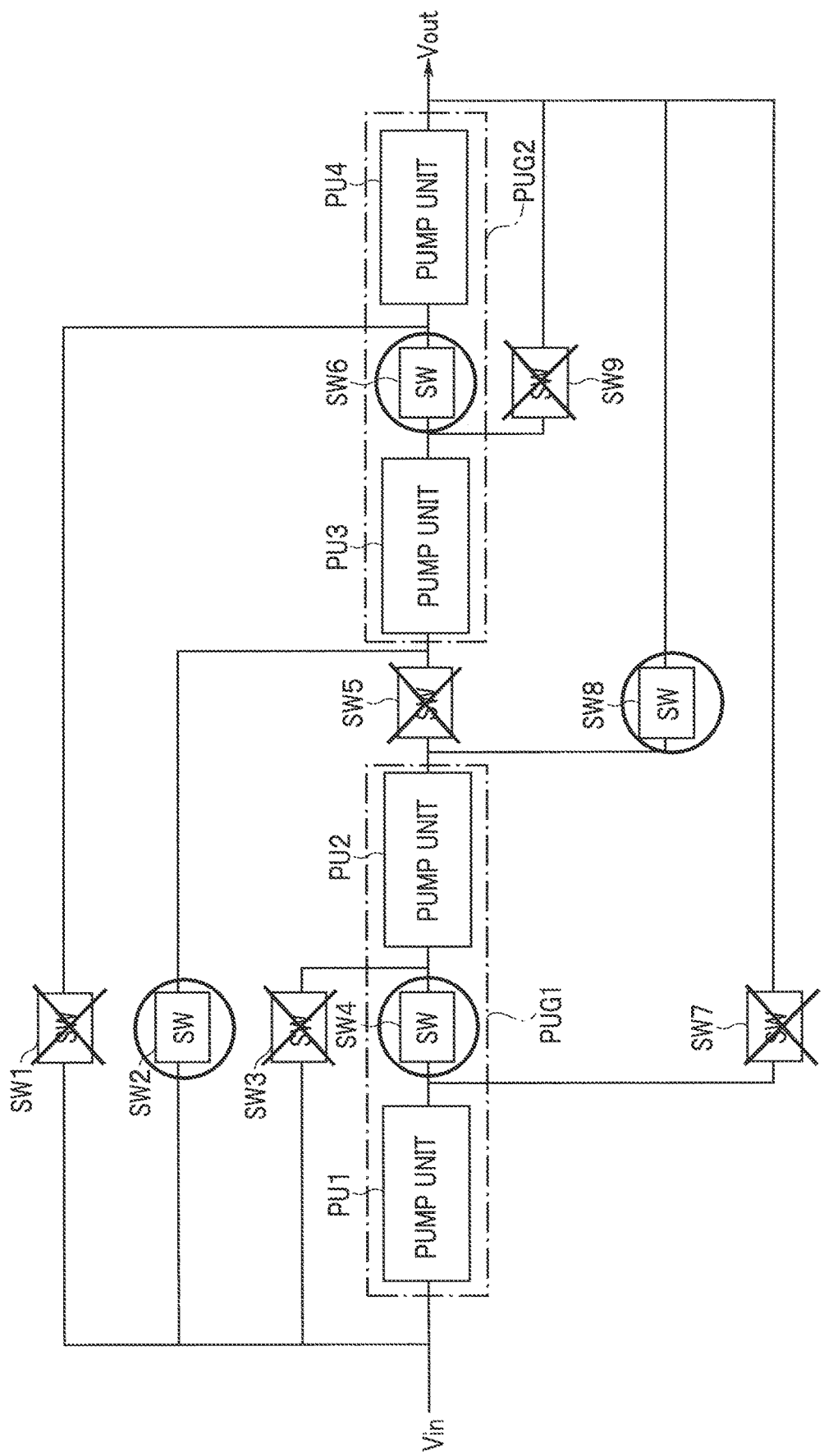
FIG. 14C is a block diagram for description of a configuration of a second state.

The four pump units PU1 to PU4 included in the second pump 281B can achieve three circuit configurations below by switching on and off the switch circuits SW1 to SW9. FIGS. 14B to 14D are each a block diagram illustrating an example of a specific connection state of units included in the second pump 281B. The first circuit configuration (first state) is a configuration in which the four pump units PU1 to PU4 are connected in parallel between input and output terminals. FIG. 14B is a block diagram for description of the configuration of the first state. As illustrated in FIG. 14B, the four pump units PU1 to PU4 are connected in parallel between the input and output terminals when the switch circuits SW1 to SW3 and SW7 to SW9 are turned on and the switch circuits SW4 to SW6 are turned off.

The second circuit configuration (second state) is a configuration in which the pump units PU1 and PU2 are connected in series as a pump unit group PUG1, the pump units PU3 and PU4 are connected in series as a pump unit group PUG2, and the pump unit groups PUG1 and PUG2 are connected in parallel. FIG. 14C is a block diagram for description of the configuration of the second state. As illustrated in FIG. 14C, in the second state, the switch circuits SW2, SW4, SW6, and SW8 are turned on and the switch circuits SW1, SW3, SW5, SW7, and SW9 are turned off. When the switch circuit SW4 is turned on, the pump units PU1 and PU2 are connected in series as the pump unit group PUG1. When the switch circuit SW6 is turned on, the pump units PU3 and PU4 are connected in series as the pump unit group PUG2. When the switch circuits SW2 and SW8 are turned on, the pump unit groups PUG1 and PUG2 are connected in parallel between the input and output terminals.

The third circuit configuration is a configuration in which the pump units PU1 to PU4 are connected in series. FIG. 14D is a block diagram for description of a configuration of a third state. As illustrated in FIG. 14D, when the switch circuits SW4 to SW6 are turned on and the switch circuits SW1 to SW3 and SW7 to SW9 are turned off, the four pump units PU1 to PU4 are connected in series between the input and output terminals.

Figure 16:
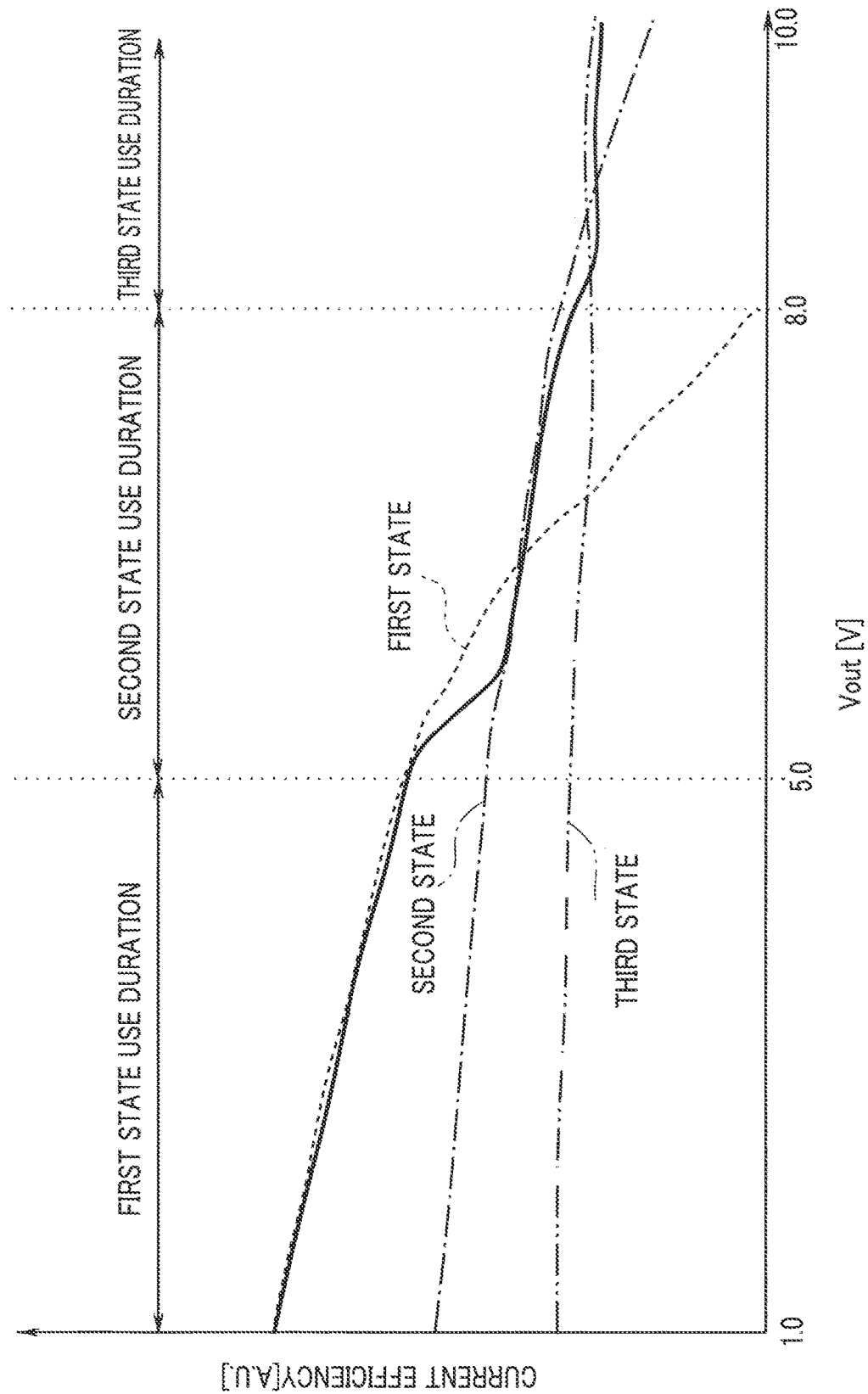
FIG. 16 is a diagram for description of a characteristic of current efficiency for output voltage at a second pump 281B.

FIG. 16 is a diagram for description of a characteristic of current efficiency for output voltage at the second pump 281B. In FIG. 16, a dotted line represents a characteristic of the first state, a dashed and single-dotted line represents a characteristic of the second state, and a dashed and double-dotted line represents a characteristic of the third state. In addition, a solid line represents a characteristic when efficient current supply is achieved at the second pump. As illustrated in FIG. 16, the current efficiency characteristic of the second pump 281B is different among the circuit configurations. In a case of the first state (FIG. 14B), that is, the circuit configuration in which the pump units PU1 to PU4 are connected in parallel between the input and output terminals, current can be supplied more efficiently than in the other states in a region in which the output voltage Vout is low (for example, a region of 5 V or lower). However, as the output voltage Vout increases, the current efficiency decreases, and current cannot be supplied when the output voltage Vout exceeds a certain value (for example, 8 V).

In a case of the second state (FIG. 14C), that is, the circuit configuration in which two pump unit groups PUG each consisting of two pump units PU connected in series between the input and output terminals are connected in parallel, the current efficiency is lower than in the first state and higher than in the third state in a region in which the output voltage Vout is low. As the output voltage Vout increases, the current efficiency decreases, but a degree (characteristic gradient) of the decrease of the current efficiency relative to the increase of the output voltage Vout is smaller than in the first state, and thus current can be supplied more efficiently than in the first state when the output voltage Vout exceeds certain voltage (for example, 5 V). However, the decrease degree (characteristic gradient) of the current efficiency is larger than in the third state, and thus the current efficiency is lower than in the third state in a region in which the output voltage Vout is high (for example, a region of 8 V or higher). In other words, in the second state, current can be supplied more efficiently than in the other states in a region in which the output voltage Vout is intermediate (for example, a region in which the output voltage Vout is 5 V to 8 V).

In a case of the third state (FIG. 14D), that is, the circuit configuration in which the pump units PU1 to PU4 are connected in series between the input and output terminals, the current efficiency is lower than in the first and second states in a region in which the output voltage Vout is low. However, the decrease degree (characteristic gradient) of the current efficiency is smaller than in the first and second states. Therefore, the current efficiency is higher than in the first and second states in a region in which the output voltage Vout is high (for example, a region of 8 V or higher). In other words, in the third state, current can be supplied more efficiently than in the other states in a region in which the output voltage Vout is high (for example, a region in which the output voltage Vout is 8 V or higher).

In this manner, current can be most efficiently supplied with the circuit configuration of the first state in a region in which the output voltage is low (for example, a region of 5 V or lower), and current can be most efficiently supplied with the circuit configuration of the second state in a region in which the output voltage is intermediate (for example, a region of 5 V to 8 V). Current can be most efficiently supplied with the circuit configuration of the third state in a region in which the output voltage is high (for example, a region of 8 V or higher). Thus, the second pump 281B is switched, in accordance with the output voltage, to a state in which current can be efficiently supplied, and is used. In other words, a current characteristic achieved at the second pump 281B is the characteristic illustrated with the solid line in FIG. 16. Note that switching of a state of the second pump 281B is controlled by the sequencer 27. The sequencer 27 instructs the second pump 281B to switch the circuit configurations in accordance with a set value of the output voltage Vout.

Figure 17:
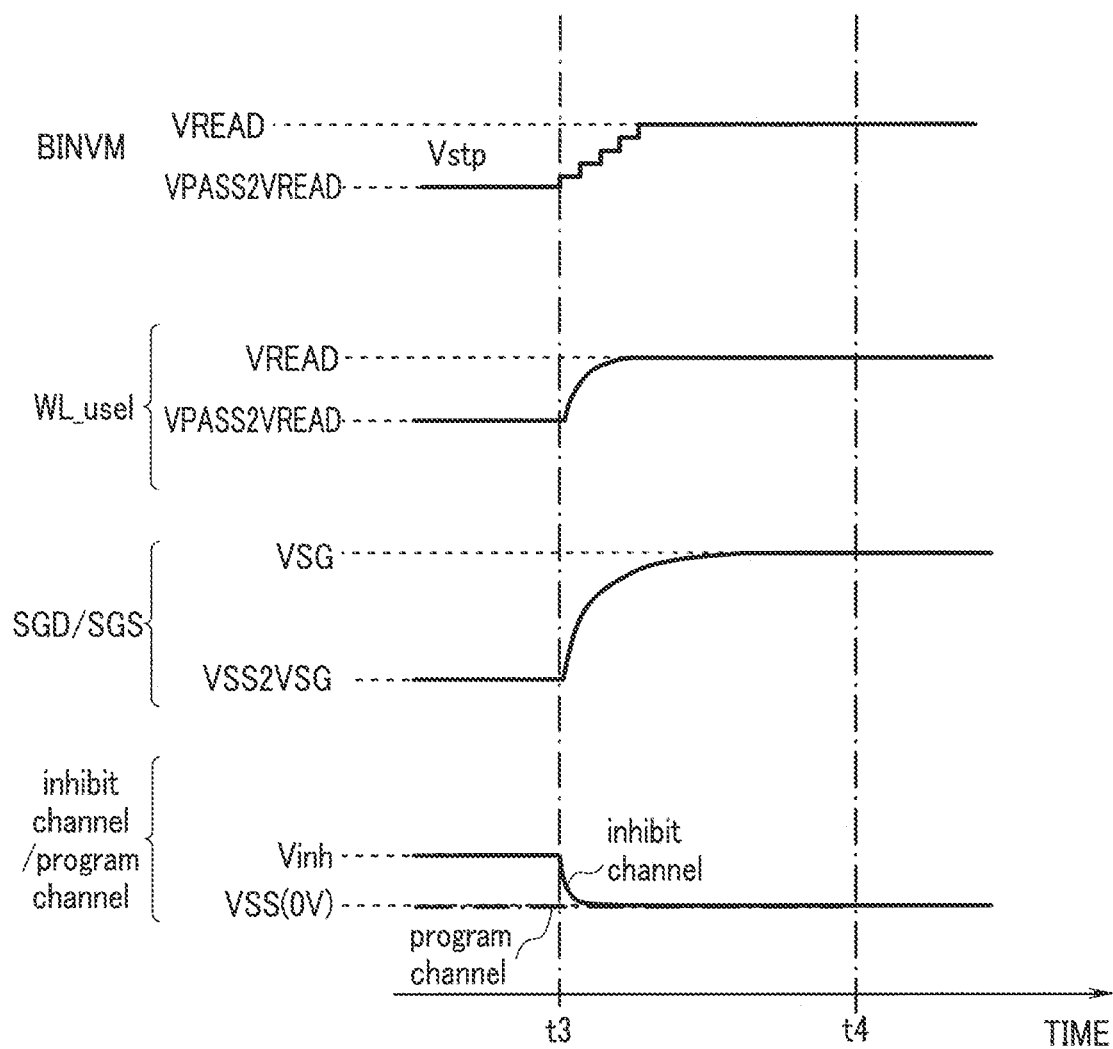
FIG. 17 is a diagram for description of step-up operation control of a pump in the verify operation.

Operation of the non-volatile memory 2 is potentially adversely affected by instantaneous increase in a consumption amount of current. Thus, when the signal lines SG0 to SG4 and CG0 to CG7 is charged by the voltage supply circuit 28, step-by-step charging is performed at stages without abrupt charging. FIG. 17 is a diagram for description of step-up operation control of a pump in the verify operation. The step-up operation control of a pump in the verify operation will be described below with an example of operation control of the second pump 281B in the USTRDIS duration.

The voltage of the non-selected word line WL_usel is equal to the voltage VPASS2VREAD (for example, 6 V) at time point t3. In the USTRDIS duration, the voltage of the non-selected word line WL_usel needs to be stepped up to the voltage VREAD (for example, 8 V). At time point t3, when charge operation is to be performed with the set value of the output voltage Vout of the second pump 281B at 8 V, the second pump 281B continuously drives the pump units PU1 to PU4 until the output voltage Vout reaches 8 V. In other words, the pump units PU1 to PU4 continuously execute step-up operation in accordance with a period of the input clock signal CLK until the output voltage Vout reaches 8 V. For example, when Vout is stepped up by 0.2 V through single pumping operation, the pumping operation needs to be performed 10 times to step up the output voltage Vout from 6 V to 8 V. In a case in which the pumping operation is continuously executed 10 times, current consumption for charging concentrates in 10 periods of the clock signal CLK. In other words, a peak current amount of current consumed per unit time becomes extremely large at time point t3.

To prevent concentration of current consumption in a short time and reduce the peak current amount, the sequencer 27 does not initially set the output voltage Vout of the second pump 281B to 8 V, but provides a plurality of intermediate set values at steps of step voltage Vstp (for example, 0.4 V) and increases the output voltage Vout at stages. When the output voltage Vout of the second pump 281B has reached an intermediate set value, the sequencer 27 increases the set value to a next intermediate set value after elapse of a predetermined duration (stop duration) and executes the step-up operation.

In FIG. 17, BINVM represents the set value of the output voltage Vout of the second pump 281B, which is set by the sequencer 27. At time point t3, the sequencer 27 sets the output voltage Vout of the second pump 281B to a value (for example, 6.4 V) incremented from the voltage VPASS2VREAD (for example, 6 V) by the step voltage Vstp (for example, 0.4 V). The second pump 281B steps up the output voltage Vout by 0.4 V by, for example, performing the pumping operation twice. When the stop duration has elapsed since end of the step-up operation of the second pump 281B, the sequencer 27 sets the output voltage Vout of the second pump 281B to a value (for example, 6.8 V) further incremented from the output voltage Vout of the second pump 281B by 0.4 V. The sequencer 27 increases the set value by the step voltage Vstp (for example, 0.4 V) until the output voltage Vout of the second pump 281B reaches the voltage VREAD (for example, 8 V). As described above, the pumping operation can be performed in a dispersed manner by increasing the set value of the output voltage Vout of the second pump 281B at stages with the stop duration, and thus current consumption can be prevented from concentrating in a short time and the peak current amount can be reduced.

(2-4. Potential Change at Non-Selected Word Line in USTRDIS Duration)

Figure 18:
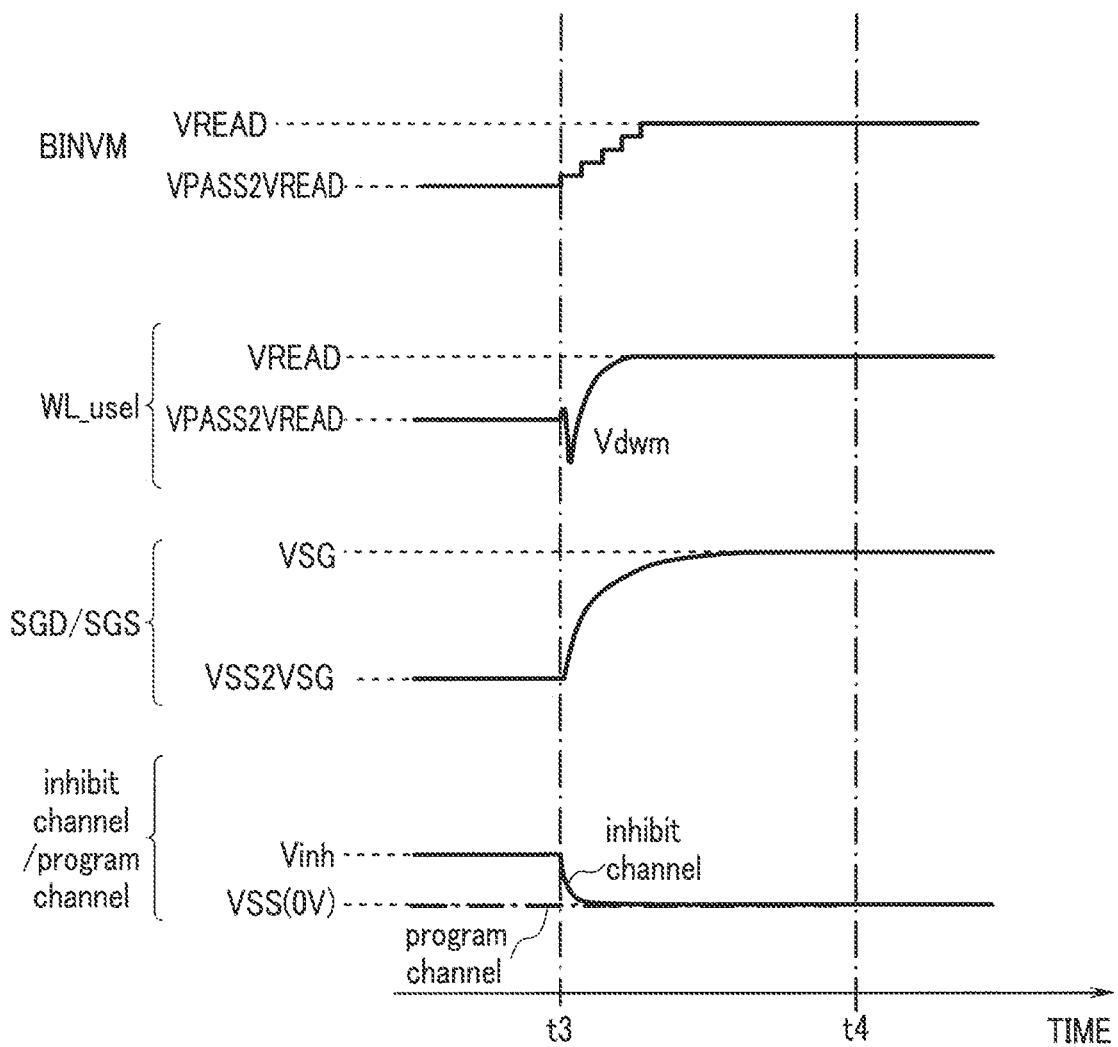
FIG. 18 is a diagram illustrating potential change at a non-selected word line in an USTRDIS duration.

FIG. 18 is a diagram illustrating potential change at a non-selected word line in the USTRDIS duration. As described above, all-channel conduction is performed in the USTRDIS duration to prevent unintended increase of the threshold voltage. In other words, the voltage VSG (for example, 5 V) for turning on the select gate transistors ST1 and ST2 is applied to the select gate lines SGD_sel, SGD_usel, and SGS. The sufficiently high voltage VREAD (for example, 8 V) that is necessary for turning on each memory cell transistor is applied to the non-selected word line WL_usel.

In the VPASS2VREAD duration (duration from time point t2 to time point t3) right before the USTRDIS duration, the inhibit channel potential (channel potential of the NAND string corresponding to the "1" writing target bit line BL) is boosted to a predetermined level by capacitive coupling between the inhibit channel and each of the selected word line WL_sel and the non-selected word line WL_usel.

At time point t3, when the select gate transistors ST1 and ST2 are turned on, all channels conduct electricity, and accordingly, the inhibit channel potential decreases to the ground voltage Vss. Along with the decrease of the inhibit channel potential, the voltage of the non-selected word line WL_usel decreases due to capacitive coupling between the non-selected word line WL_usel and the inhibit channel. Hereinafter, an amount of voltage decrease from the voltage VPASS2VREAD at the non-selected word line WL_usel is referred to as voltage Vdwn.

At time point t3, the sequencer 27 sets a first intermediate set value of the output voltage Vout of the second pump 281B to a value higher than the voltage VPASS2VREAD (for example, 6 V) by the step voltage Vstp (for example, 0.4 V). To step up the output voltage Vout to the first intermediate set value, the second pump 281B continuously drives the pump units PU1 to PU4 and executes the pumping operation. As the voltage of the non-selected word line WL_usel decreases, the second pump 281B needs to step up the output voltage Vout by a sum of the step voltage Vstp and the voltage Vdwn. Therefore, the pumping operation is continuously performed in a duration in which the output voltage Vout is being stepped up to the first intermediate set value. As a result, current consumption concentrates in a short time and peak current increases.

When the first intermediate set value is set to 6.4 V, the second pump is set to the second state. Since the voltage of the non-selected word line WL_usel decreases from the voltage VPASS2VREAD by the voltage Vdwn, the second pump needs to set to the first state. However, with the above-described control, the second pump is set to the second state in which the current efficiency is lower than in the first state, and thus the pumping operation necessary for stepping up increases.

(2-5. Operation of Voltage Generation Circuit in Embodiment)

Figure 19:
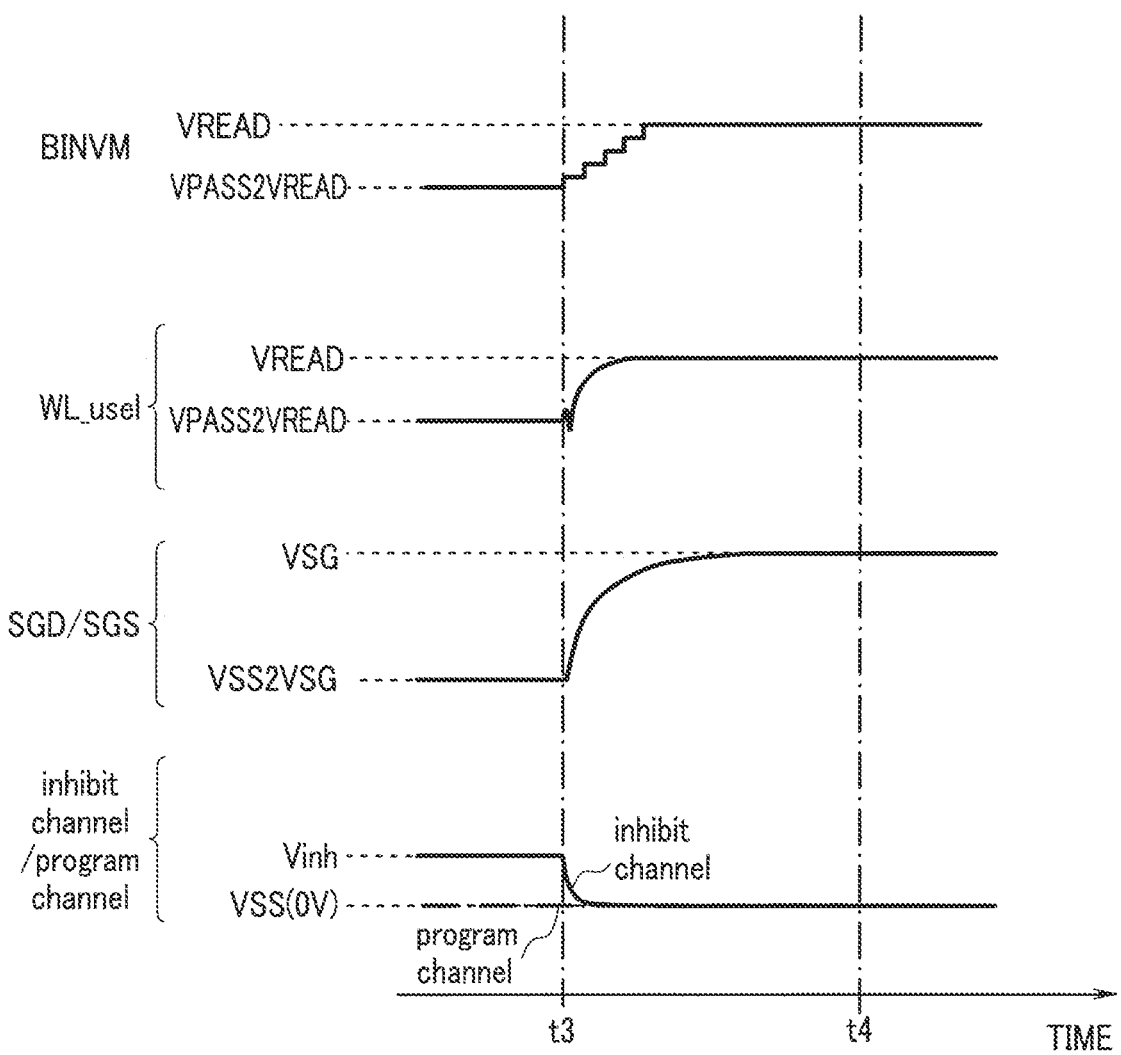
FIG. 19 is a diagram for description of step-up operation control of the pump in a first-half loop of a write sequence.
Figure 20:
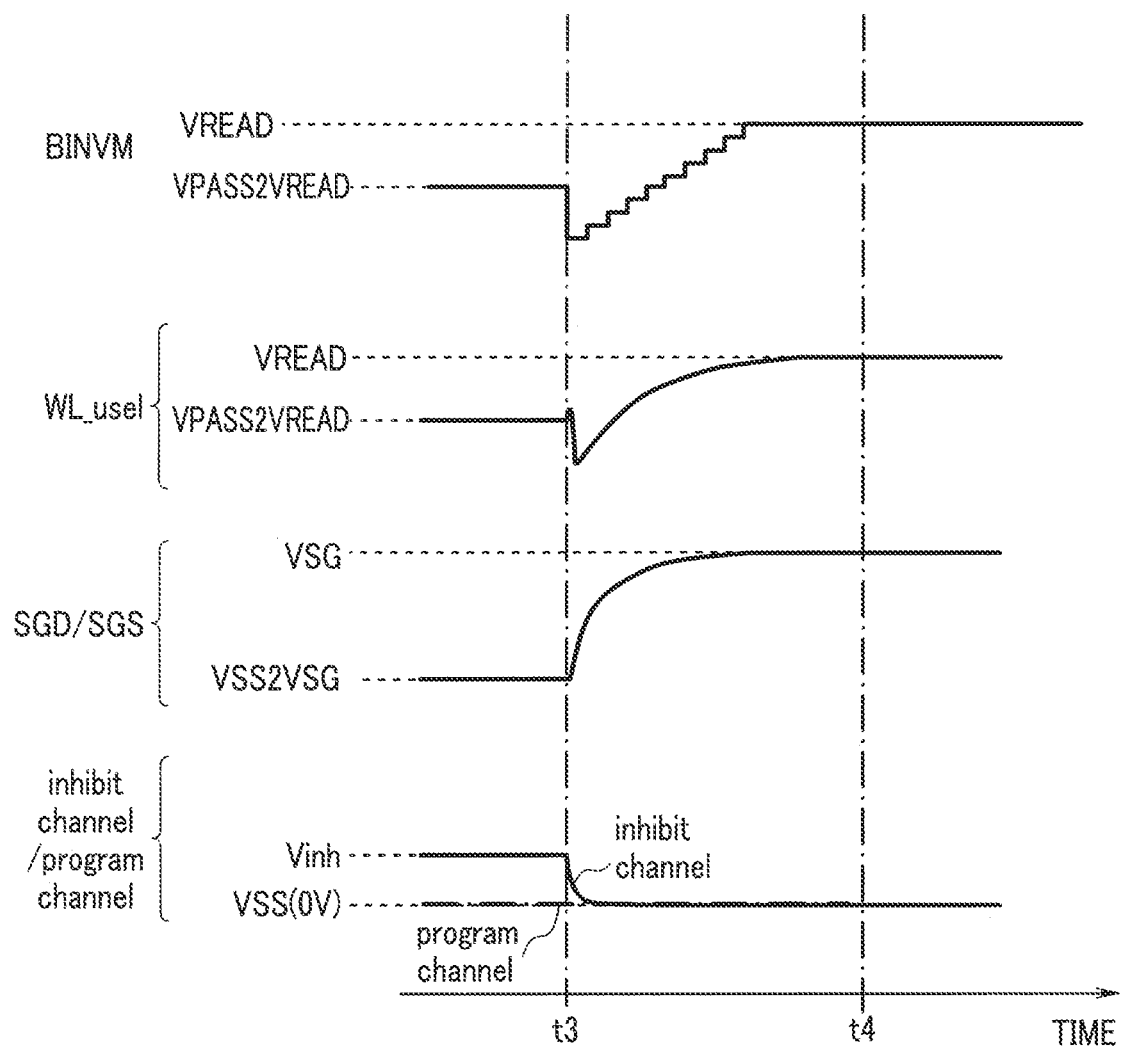
FIG. 20 is a diagram for description of the step-up operation control of the pump in a second-half loop of the write sequence.

Subsequently, operation control of the second pump 281B in the present embodiment will be described below with reference to FIGS. 19 and 20. FIG. 19 is a diagram for description of step-up operation control of the pump in a first-half loop of a write sequence. FIG. 20 is a diagram for description of step-up operation control of the pump in a second-half loop of the write sequence.

The voltage decrease at the non-selected word line WL_usel in the USTRDIS duration is attributable to capacitive coupling with the inhibit channel. Thus, the number of NAND strings corresponding to "1" writing target bit lines BL is small and the number of NAND strings corresponding to "0" writing target bit lines BL is large in a state in which the number of "1" writing target bit lines BL is small and the number of "0" writing target bit lines BL is large in the first-half loop of the write sequence. Therefore, effective facing area of the inhibit channel and the non-selected word line WL_usel is small and effective facing area of a program channel and the non-selected word line WL_usel is large. As a result, the amount (voltage Vdwn) of voltage decrease at the non-selected word line WL_usel along with decrease of the inhibit channel potential right after start of the USTRDIS duration is small.

As the loop of the write sequence proceeds, the number of "1" writing target bit lines BL increases and the number of "0" writing target bit lines BL decreases. Accordingly, the number of NAND strings corresponding to "1" writing target bit lines BL increases and the number of NAND strings corresponding to "0" writing target bit lines BL decreases. Therefore, the effective facing area of the inhibit channel and the non-selected word line WL_usel increases and the effective facing area of the program channel and the non-selected word line WL_usel decreases. As a result, the amount (voltage Vdwn) of voltage decrease at the non-selected word line WL_usel along with decrease of the inhibit channel potential right after start of the USTRDIS duration is large. Thus, in the present embodiment, the loop of the write sequence is divided into two and operation of the second pump 281B is controlled by different methods in the first-half loop and the second-half loop.

As illustrated in FIG. 19, operation control of the second pump 281B in the first-half loop is performed by a method same as the method described with reference to FIG. 17. In other words, at time point t3, the sequencer 27 sets the first intermediate set value of the output voltage Vout of the second pump 281B to a value (for example, 6.4 V) incremented from the voltage VPASS2VREAD (for example, 6 V) by the step voltage Vstp (for example, 0.4 V). In addition, the state of the second pump 281B is set to a state in accordance with the set value of the output voltage Vout. For example, the sequencer 27 sets the state of the second pump 281B to the second state when the set value of the output voltage Vout is 6.4 V and the current efficiency characteristic of the second pump 281B is the characteristic illustrated in FIG. 16. The second pump 281B steps up the output voltage Vout to the first intermediate set value (for example, 6.4 V) in accordance with control by the sequencer 27. In the initial step-up operation in the USTRDIS duration, the second pump 281B needs to step up the output voltage Vout by the sum of the step voltage Vstp and the voltage Vdwn. However, in the first-half loop, the amount (voltage Vdwn) of voltage decrease at the non-selected word line WL_usel is small, and accordingly, increase of the pumping operation is small. Thus, although the peak current increases, the amount of the increase is small.

After elapse of a predetermined stop duration since the output voltage Vout of the second pump 281B is stepped up to the first intermediate set value, the sequencer 27 sets the next intermediate set value of the output voltage Vout of the second pump 281B to a value incremented by the step voltage Vstp. The sequencer 27 also sets the state of the second pump 281B to a state in accordance with the next intermediate set value. Subsequently, the sequencer 27 increases the intermediate set value of the output voltage Vout of the second pump 281B at stages with the stop duration until the output voltage Vout of the second pump 281B reaches the voltage VREAD.

In operation control of the second pump 281B in the second-half loop, a level of the first intermediate set value is different from the level in the control in the first-half loop. As illustrated in FIG. 20, at time point t3, the sequencer 27 sets the first intermediate set value of the output voltage Vout of the second pump 281B to a value (for example, 4.8 V) lower than the voltage VPASS2VREAD (for example, 6 V). An amount of decrease from the voltage VPASS2VREAD is determined with taken into account the amount (voltage Vdwn) of voltage decrease at the non-selected word line WL_usel. The state of the second pump 281B is set to a state in accordance with the set value of the output voltage Vout. For example, when the set value of the output voltage Vout is 4.8 V and the current efficiency characteristic of the second pump 281B is the characteristic illustrated in FIG. 16, the sequencer 27 sets the state of the second pump 281B to the first state. The second pump 281B steps up the output voltage Vout to the first intermediate set value (for example, 4.8 V) in accordance with control by the sequencer 27. Operation control after the output voltage Vout is stepped up to the first intermediate set value is same as the operation control in the first-half loop illustrated in FIG. 19.

In control in a comparative example illustrated in FIG. 18, the first intermediate set value of the output voltage Vout is set to a sum of the voltage VPASS2VREAD and the step voltage Vstp (for example, 6.4 V). However, in control in the present embodiment illustrated in FIG. 20, the first intermediate set value of the output voltage Vout is set to a value (for example, 4.8 V) lower than the voltage VPASS2VREAD (for example, 6 V). In other words, in the present embodiment, in step-up operation control of the second pump 281B in the second-half loop, the first intermediate set value of the output voltage Vout is set to a value close to potential of the non-selected word line WL_usel before stepping up, with taken into account the amount (voltage Vdwn) of voltage decrease at the non-selected word line WL_usel. In addition, by controlling the first intermediate set value in this manner, it is possible to set the state of the second pump 281B to a state in which current can be most efficiently supplied near the potential of the non-selected word line WL_usel before stepping up with taken into account the amount (voltage Vdwn) of voltage decrease at the non-selected word line WL_usel. Thus, the number of times of the pumping operation continuously executed in a duration in which the output voltage Vout is being stepped up to the first intermediate set value can be reduced. Therefore, current consumption can be prevented from concentrating in a short time, and thus the peak current can be reduced.

When the first intermediate set value is set small, a longer step-up time is taken until the output voltage Vout reaches a target value (the voltage VREAD). However, in the embodiment, a standard sequence is divided into the first-half loop and the second-half loop, and the intermediate set value is set to a normal value (the sum of the voltage VPASS2VREAD and the step voltage Vstp) in the first-half loop in which the amount (voltage Vdwn) of voltage decrease at the non-selected word line WL_usel is small. Accordingly, a long execution time of the whole standard sequence can be avoided.

Note that any boundary may be set between the first-half loop and the second-half loop. For example, the boundary may be a timing when all cells at a second highest level (F level) in a writing target page have clear passed verify, or a timing when verify for this level has ended a predetermined number of times. For example, in a case of the standard the write sequence illustrated in FIG. 9, the boundary is set to any loop among twelfth to seventeenth loops, the control as illustrated in FIG. 19 is performed in the first-half loop before the boundary, and the control as illustrated in FIG. 20 is performed in the second-half loop after the boundary.

For example, the boundary may be a timing when all cells at a third highest level (E level) in a write operation target page have passed verify, or a timing when verify for this level has ended a predetermined number of times. The present embodiment is not limited to these examples, but the boundary between the first-half and second-half loops may be favorably set based on a progress degree of the write operation.

In the above description, the standard sequence is divided into two, and setting of the first intermediate set value is changed between the first-half loop and the second-half loop. However, the standard sequence may be divided into three or more and the first intermediate set value may be adjusted for each division range with taken into account the amount (voltage Vdwn) of voltage decrease at the non-selected word line WL_usel.

Second Embodiment

Subsequently, a semiconductor storage device according to a second embodiment will be described below. In the semiconductor storage device of the embodiment, a method of controlling voltage supplied to the non-selected word line WL_usel is different from the method in the semiconductor storage device of the first embodiment described above. A device configuration and other operation are same as those in the first embodiment, and description thereof is omitted. The following description will be made only on any difference from the first embodiment.

Figure 21:
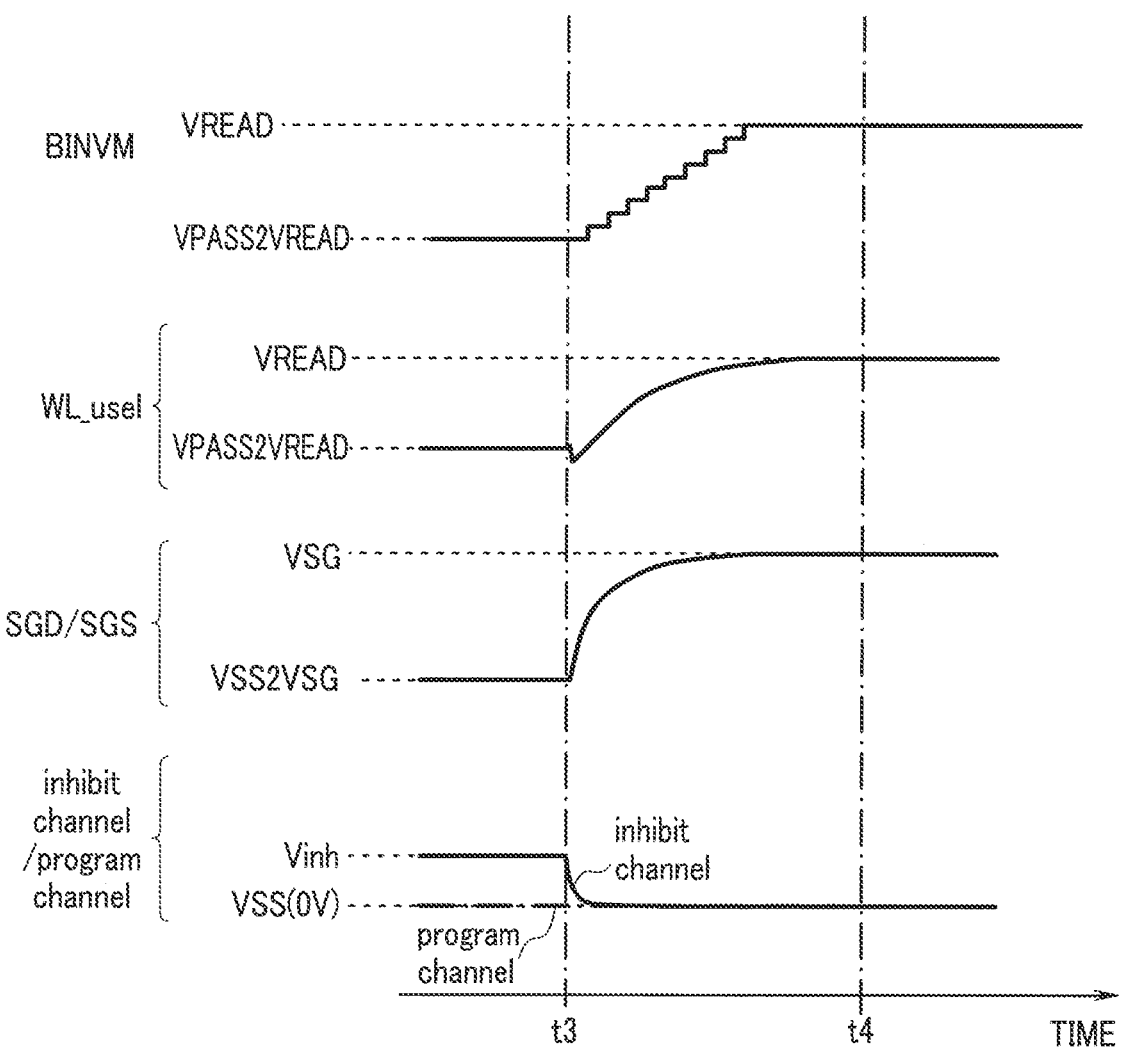
FIG. 21 is a diagram for description of step-up operation control of the pump in the second-half loop of the write sequence in a second embodiment.

FIG. 21 is a diagram for description of step-up operation control of the pump in the second-half loop of the write sequence in the second embodiment. Step-up operation control of the pump in the first-half loop of the write sequence is same as the step-up operation control in the first embodiment described above with reference to FIG. 19.

As illustrated in FIG. 21, in the second-half loop, the sequencer 27 controls, to a value lower than a voltage value in the first-half loop, the voltage VPASS2VREAD after electrical discharging of the non-selected word line WL_usel in the VPASS2VREAD duration. For example, when the voltage VPASS2VREAD in the first-half loop is 6.0 V, the sequencer 27 changes the voltage VPASS2VREAD in the second-half loop to 4.8 V. Note that the value of the voltage VPASS2VREAD in the second-half loop is determined with taken into account the amount of voltage decrease at the non-selected word line WL_usel along with decrease of the inhibit channel potential.

As illustrated in FIG. 21, the sequencer 27 sets the first intermediate set value of the output voltage Vout of the second pump 281B to a value (for example, 4.8 V) incremented from the voltage VPASS2VREAD (for example, 4.4 V) by the step voltage Vstp (for example, 0.4 V). The sequencer 27 sets the state of the second pump 281B to a state in accordance with the set value of the output voltage Vout. For example, when the set value of the output voltage Vout is 4.4 V and the current efficiency characteristic of the second pump 281B is the characteristic illustrated in FIG. 16, the sequencer 27 sets the state of the second pump 281B to the first state. The second pump 281B steps up the output voltage Vout to the first intermediate set value (for example, 4.8 V) in accordance with control by the sequencer 27. Operation control after the output voltage Vout is stepped up to the first intermediate set value is same as the operation control in the first-half loop illustrated in FIG. 19.

In the present embodiment, since the value of the voltage VPASS2VREAD in the second-half loop is set to be smaller than the value in the first-half loop in this manner, the amount (voltage Vdwn) of voltage decrease at the non-selected word line WL_usel along with decrease of the inhibit channel potential becomes small. In first step-up operation in the USTRDIS duration, the second pump 281B needs to step up the output voltage Vout by the sum of the step voltage Vstp and the voltage Vdwn. However, since the voltage Vdwn is smaller than the voltage Vdwn in the comparative example illustrated in FIG. 18, the number of times of the pumping operation in the step-up operation up to the first intermediate set value can be reduced. Therefore, current consumption can be prevented from concentrating in a short time, and thus the peak current can be reduced. Moreover, since the value of the voltage VPASS2VREAD is set small, the inhibit channel potential (Vinh) in the VPASS2VREAD duration decreases, and accordingly, influence of the voltage decrease at the non-selected word line WL_usel when the non-select gate line SGD_usel is turned on decreases as well.

Note that when the value of the voltage VPASS2VREAD in the second-half loop is set lower than the value in the first-half loop, a longer step-up time is taken until the output voltage Vout reaches a target value (the voltage VREAD). Furthermore, a current reduction effect in the VPASS2VREAD duration decreases. However, in the embodiment, the standard sequence is divided into the first-half and second-half loops, and the value of the voltage VPASS2VREAD is set to a high value without change in the first-half loop in which the amount (voltage Vdwn) of voltage decrease at the non-selected word line WL_usel is small. Accordingly, a long execution time of the whole standard sequence can be avoided while decrease of the current reduction effect is prevented.

In the present embodiment as well, similarly to the first embodiment, the boundary between the first-half and second-half loops may be favorably set based on the progress degree of the write operation. Moreover, the standard sequence may be divided into three or more and the value of the voltage VPASS2VREAD may be individually set for each division range.

While certain embodiments have been described, these embodiments have been presented by way of example only, and are not intended to limit the scope of the inventions. Indeed, the novel devices and systems described herein may be embodied in a variety of other forms; furthermore, various omissions, substitutions and changes in the form of the devices and systems described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a plurality of first memory cells;
a word line connected to gates of the first memory cells;
a plurality of first select gate transistors connected to first ends of the first memory cells, respectively;
a first select gate line connected to gates of the first select gate transistors;
a plurality of bit lines electrically connected to the first ends of the first memory cells via the first select gate transistors, respectively;
a voltage generation circuit configured to generate a voltage to be supplied to the word line; and
a control circuit configured to execute a write sequence that includes a plurality of loops, each of the plurality of loops including (i) a program operation to increase a threshold voltage of at least part of the first memory cells to thereby write data to the first memory cells and (ii) a verify operation to verify the data written to the first memory cells,
wherein:
the voltage generation circuit is configured to generate the voltage to be supplied to the word line such that the voltage has a first set value at a start of the verify operation in a first loop among the plurality of loops, and such that the voltage has a second set value at a start of the verify operation in a second loop among the plurality of loops, the second set value being lower than the first set value, and the second loop being later than the first loop in the write sequence,
the first memory cells include a selected memory cell and a non-selected memory cell,
in the program operation, the control circuit is configured to:
apply a first voltage to a first part of the bit lines, the first part being electrically connected to a first end of the selected memory cell, and
apply a second voltage to a second part of the bit lines, the second part being electrically connected to a first end of the non-selected memory cell, and
the first voltage is lower than the second voltage.

2. The semiconductor storage device according to claim 1, wherein the first memory cells comprise NAND memory cells.

3. The semiconductor storage device according to claim 1, wherein:
one of the plurality of loops included in the write sequence is a boundary loop,
the first loop is earlier than the boundary loop in the write sequence, and
the second loop is later than the boundary loop in the write sequence.

4. The semiconductor storage device according to claim 3, wherein the boundary loop is a predetermined loop among the plurality of loops included in the write sequence.

5. The semiconductor storage device according to claim 1, further comprising:
a plurality of second memory cells each having a gate connected to the word line;
a plurality of second select gate transistors connected to first ends of the second memory cells, respectively; and
a second select gate line connected to gates of the second select gate transistors,
wherein:
the bit lines are electrically connected to the first ends of the second memory cells through the second select gate transistors, respectively, and
in the program operation, the control circuit is configured to:
supply a third voltage to the first select gate line, and
supply a fourth voltage to the second select gate line.

6. The semiconductor storage device according to claim 5, wherein a threshold voltage of the second memory cells does not increase in the program operation.

7. The semiconductor storage device according to claim 1, wherein:
the voltage generation circuit is configured to increase the voltage from the first set value to a third set value during the verify operation in the first loop; and
wherein the voltage generation circuit is configured to increase the voltage from the second set value to the third set value during the verify operation in the second loop.

8. The semiconductor storage device according to claim 1, wherein the voltage generation circuit includes a plurality of pump circuits, and the control circuit is configured to control connection among the plurality of pump circuits based on current efficiencies.

9. The semiconductor storage device according to claim 8, wherein the plurality of pump circuits are controllable to be arranged in parallel in response to the voltage being within a first voltage range associated with a first current efficiency range.

10. The semiconductor storage device according to claim 9, wherein the plurality of pump circuits are controllable to be arranged in series in response to the voltage being within a second voltage range associated with a second current efficiency range.

11. A device comprising:
a plurality of memory cells;
a word line connected to the plurality of memory cells; and
a voltage generation circuit configured to:
generate a first increasing voltage to be supplied to the word line during a verify operation included in a first loop among a plurality of loops included in a write sequence, the first increasing voltage increasing from a first value to a second value; and
generate a second increasing voltage to be supplied to the word line during a verify operation included in a second loop among the plurality of loops included in the write sequence, the second increasing voltage increasing from a third value to the second value, the third value being lower than the first value, and the second loop being later than the first loop in the write sequence.

12. The device of claim 11, wherein:
the first loop further includes a first program operation to write first data to a first subset of the plurality of memory cells, and
the second loop further includes a second program operation to write second data to a second subset of the plurality of memory cells.

13. The device of claim 11, wherein:
the first loop is earlier than a boundary loop in the write sequence, and
the second loop is later than the boundary loop in the write sequence.

14. The device of claim 13, wherein the boundary loop is a predetermined loop among the plurality of loops included in the write sequence.

15. The device of claim 11, wherein the plurality of memory cells comprise NAND memory cells.

16. The device of claim 11, wherein, during the verify operation included in the second loop, the plurality of memory cells include a larger number of floating memory cells than during the verify operation included in the first loop.

17. The device of claim 11, wherein:
the voltage generation circuit includes a plurality of pump circuits, and
wherein the plurality of pump circuits are controllable to be arranged in parallel to generate a first voltage range associated with a first current efficiency range.

18. The device of claim 17, wherein the plurality of pump circuits are controllable to be arranged in series to generate a second voltage range associated with a second current efficiency range.

* * * * *